(12) United States Patent
Schmidt, III et al.

(10) Patent No.: US 10,401,431 B1
(45) Date of Patent: *Sep. 3, 2019

(54) METHODS OF MAKING AND USING AN IDENTIFICATION TAG SYSTEM FOR USE WITH AN ELECTRICAL BREAKER PANEL AND AN ELECTRICAL OUTLET

(71) Applicants: Arthur T. Schmidt, III, Emmaus, PA (US); Hayden Schmidt, Emmaus, PA (US)

(72) Inventors: Arthur T. Schmidt, III, Emmaus, PA (US); Hayden Schmidt, Emmaus, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/394,311

(22) Filed: Apr. 25, 2019

Related U.S. Application Data

(63) Continuation-in-part of application No. 16/206,646, filed on Nov. 30, 2018, now Pat. No. 10,325,192.

(51) Int. Cl.
| | | |
|---|---|---|
| *G06K 19/07* | (2006.01) | |
| *G01R 31/327* | (2006.01) | |
| *H02G 3/08* | (2006.01) | |

(52) U.S. Cl.
CPC ....... *G01R 31/327* (2013.01); *G06K 19/0723* (2013.01); *H02G 3/081* (2013.01)

(58) Field of Classification Search
CPC .......................... G06K 19/0723; G01R 31/327
USPC .................................................. 235/487, 492
See application file for complete search history.

(56) References Cited

U.S. PATENT DOCUMENTS

| | | |
|---|---|---|
| 4,801,868 A | 1/1989 | Brooks |
| 6,246,304 B1 | 6/2001 | Gasper |
| 6,593,530 B2 | 7/2003 | Hunt |
| 6,903,289 B2 | 6/2005 | Tongo et al. |
| 7,064,635 B2 | 6/2006 | Bogdon et al. |
| 7,657,763 B2* | 2/2010 | Nelson ................ H02J 13/0013 323/234 |
| 8,205,996 B2 | 6/2012 | Combs |
| 8,604,915 B2 | 12/2013 | Clarke |
| 8,774,829 B2* | 7/2014 | Farley ................... G01S 5/0036 455/456.1 |
| 9,575,091 B2* | 2/2017 | Reeder, III ........... G01R 1/0408 |
| 9,983,646 B2 | 5/2018 | Mullen et al. |

(Continued)

FOREIGN PATENT DOCUMENTS

| | | |
|---|---|---|
| EP | 549610 | 1/2013 |
| WO | WO 2014099154 | 6/2014 |

*Primary Examiner* — Paultep Savusdiphol
(74) *Attorney, Agent, or Firm* — James R. McDaniel

(57) ABSTRACT

A system for identifying which electrical outlets are electrically connected to a circuit breaker, including an electrical outlet faceplate cover having a plurality of electrical outlet openings and a fastener located between the plurality of electrical outlet openings such that the electrical outlet faceplate cover is located over an electrical outlet, a circuit breaker panel having at least one circuit breaker located on the circuit breaker panel, and a near field communications tag located on a back side of the electrical outlet faceplate cover, wherein the near field communications tag is operatively connected to the fastener such that the near field communications tag contains information related to which of the at least one circuit breakers is electrically connected to the electrical outlet.

15 Claims, 15 Drawing Sheets

(56) References Cited

U.S. PATENT DOCUMENTS

| | | | |
|---|---|---|---|
| 2007/0155349 A1* | 7/2007 | Nelson | H02J 13/0013 455/128 |
| 2010/0237985 A1* | 9/2010 | Landau-Holdsworth | B60L 3/0069 340/5.8 |
| 2012/0015665 A1* | 1/2012 | Farley | G01S 5/0036 455/456.1 |
| 2012/0106672 A1* | 5/2012 | Shelton | B60L 3/0069 375/295 |
| 2012/0109401 A1* | 5/2012 | Shelton | B60L 3/0069 700/297 |
| 2012/0109402 A1* | 5/2012 | Shelton | B60L 3/0069 700/297 |
| 2012/0109798 A1* | 5/2012 | Shelton | B60L 3/0069 705/34 |
| 2012/0316698 A1* | 12/2012 | Daniel | G06F 1/266 700/297 |
| 2013/0194734 A1* | 8/2013 | Yoshikawa | H01R 13/641 361/679.01 |
| 2014/0211345 A1 | 7/2014 | Thompson et al. | |
| 2016/0020590 A1 | 1/2016 | Roosli et al. | |

\* cited by examiner

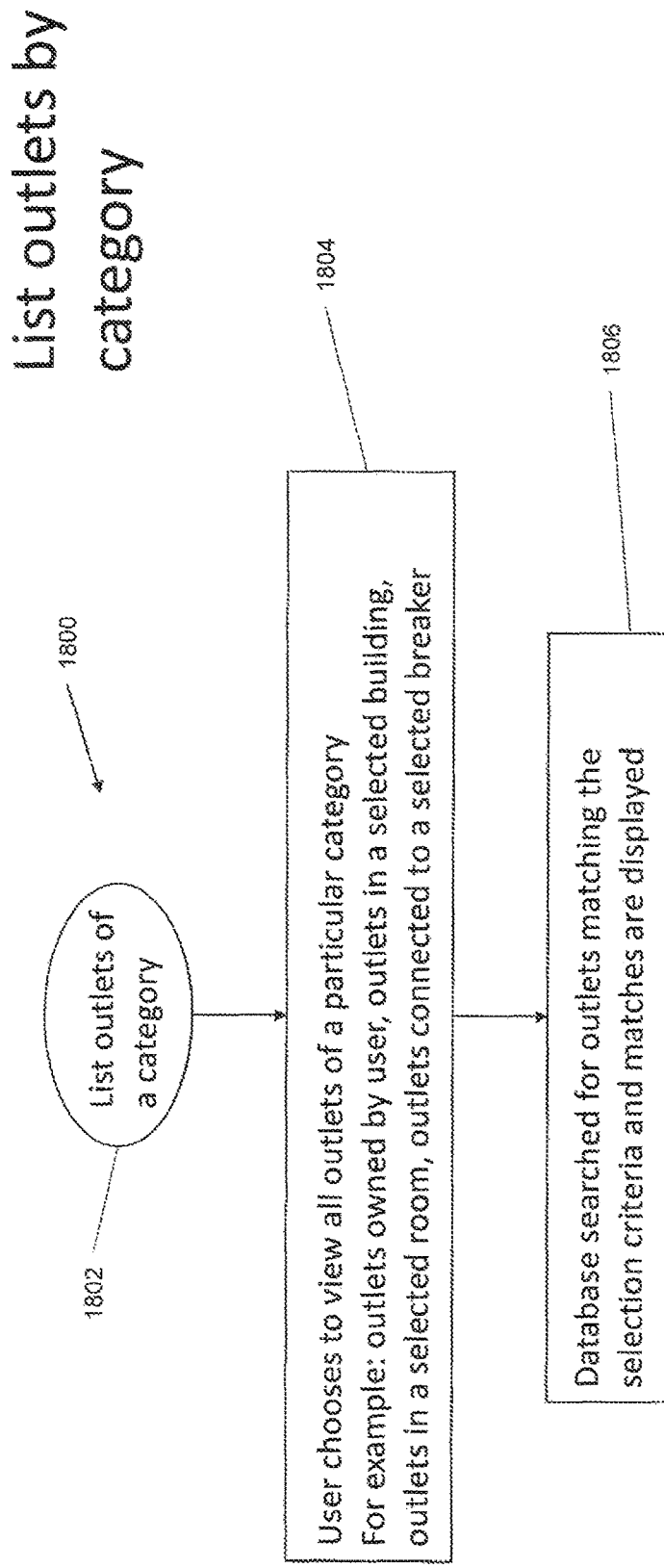

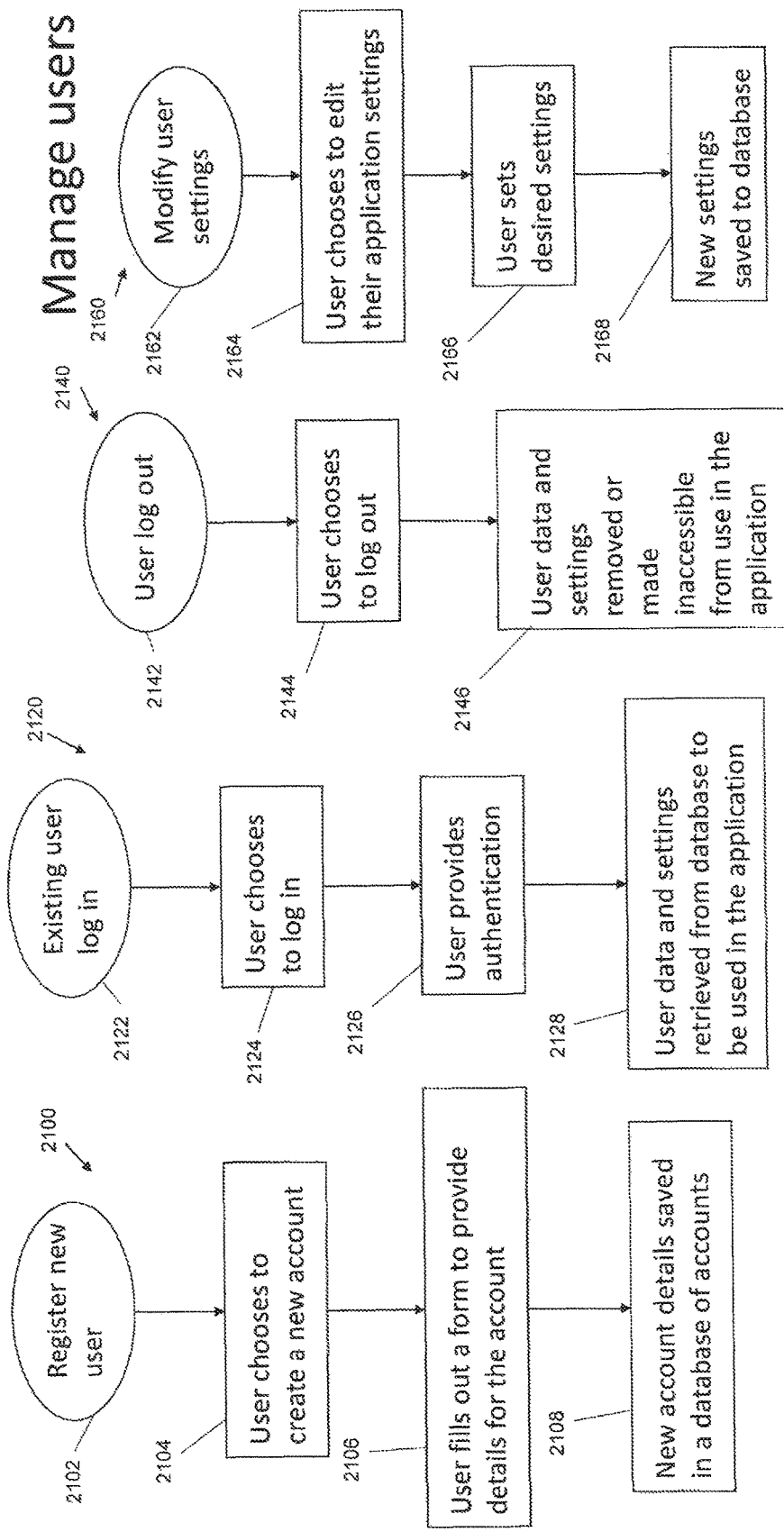

METHODS OF MAKING AND USING AN IDENTIFICATION TAG SYSTEM FOR USE WITH AN ELECTRICAL BREAKER PANEL AND AN ELECTRICAL OUTLET

CROSS-REFERENCE TO RELATED APPLICATIONS

This application is a continuation-in-part of U.S. patent application Ser. No. 16/206,646, filed on Nov. 30, 2018, which is a continuation-in-part of U.S. Patent Application 62/596,948, filed on Dec. 11, 2017, the disclosures of which are hereby incorporated by reference in their entirety to provide continuity of disclosure to the extent such disclosures are not inconsistent with the disclosure herein.

FIELD OF THE INVENTION

The present invention pertains to the field of the identification of which electrical outlets/electrical switches are electrically connected to which circuit breakers located within an electrical circuit breaker box or panel in a residential or commercial setting. In particular, the present invention discloses a near field communications (NFC) identification tag that can be placed on or near an electrical outlet/electrical switch (or electrical circuit) such that the NFC identification tag can be used to identify which electrical breaker in the electrical circuit breaker box or panel is electrically connected to and controls that particular electrical outlet/electrical switch (or electrical circuit). Also, the electrical outlets/electrical switches can be listed by category such as outlets/switches owned by a user and/or outlets/switches in a selected building. Furthermore, the circuit breakers can be monitored and/or controlled. Finally, the users of the identification tag system can be managed such as is the user a new user or an existing user.

BACKGROUND OF THE INVENTION

It is known that modern circuit breaker panels have a very messy and hard-to-use form of identification to determine which breaker switch controls a specific circuit (or electrical outlet/electrical switch) in a residential or commercial building. The lines for writing the information are small and the information written on them often needs to be changed. Furthermore, if the information regarding which circuit breaker controls which electrical circuit was originally written in pen, it can quickly turn into a complete mess of scribbles and bad handwriting. Furthermore, while masking tape or sticky notes are sometimes used to solve this issue, they are merely temporary and can just as easily fall off over time or have the writing fade away.

Prior to the present invention, as set forth in general terms above and more specifically below, it is known to employ various types of identification systems and devices to identify which circuit breaker controls a specific circuit (or electrical outlet/electrical switch) in a residential or commercial building. See for example, U.S. Pat. No. 4,801,868 by Brooks, U.S. Pat. No. 6,246,304 by Gasper, U.S. Pat. No. 6,593,530 by Hunt, U.S. Pat. No. 6,903,289 by Tongo et al., U.S. Pat. No. 7,064,635 by Bogdon et al., U.S. Pat. No. 8,205,996 by Combs, U.S. Pat. No. 8,604,915 by Clarke, U.S. Pat. No. 9,983,646 by Mullen et al., U.S. Patent Application 2014/0211345 by Thompson at al., U.S. Patent Application 2016/0020590 by Roosli et al., PCT Patent Application WO 2014/099154 by Walsh et al., and EP Patent Application 2,549,610 by Watford. While these various identification systems and devices used to identify which circuit breaker controls a specific circuit (or electrical outlet/electrical switch) in a residential or commercial building may have been generally satisfactory, there is nevertheless a need for an identification tag that can be placed on or near an electrical outlet (or electrical circuit/electrical switch, or fixture) such that the identification tag can be used to identify which electrical breaker in the electrical circuit breaker box or panel is electrically connected to and controls that particular electrical outlet (or electrical circuit/electrical switch, or fixture), the identification tag can also be used to create a list of electrical outlets/electrical switches and fixtures associated with the identification tag(s), and the circuit breakers can be monitored and or controlled through the use of the identification tag(s).

It is the purpose of this invention to fulfill these and other needs in the prior art in a manner more apparent to the skilled artisan once given the following disclosure.

BRIEF SUMMARY OF THE INVENTION

A first aspect of the present invention is a method for creating a list identifying which electrical outlets are electrically connected to a circuit breaker, including the steps of: providing an electrical outlet faceplate cover having a plurality of electrical outlet openings and a fastener located between the plurality of electrical outlet openings such that the electrical outlet faceplate cover is located over an electrical outlet; providing a circuit breaker panel having at least one circuit breaker located on the circuit breaker panel; providing a near field communications tag located on a back side of the electrical outlet faceplate cover, wherein the near field communications tag is operatively connected to the fastener such that the near field communications tag is capable of containing information related to which of the at least one circuit breaker is electrically connected to the electrical outlet; storing information related to which of the at least one circuit breaker is electrically connected to the electrical outlet in a database; providing a remote device with access to the database; rendering a user interface through which a user, via the remote device, can define an electrical outlet category, wherein the electrical outlet category specifies a relationship between the electrical outlet and the at least one circuit breaker; receiving the user defined electrical outlet category in the database via the remote device; creating, in a database, the user defined electrical outlet category based upon the relationship between the electrical outlet and the at least one circuit breaker; and providing access to execute a query regarding the user defined electrical outlet category through the remote device.

In one embodiment of the first aspect of the present invention, the method further includes the steps of determining a desired electrical outlet category; accessing the database to determine if the desired electrical outlet category has been stored in the database; and if the desired electrical outlet category has been stored in the database, providing access to the desired electrical outlet category.

In another embodiment of the first aspect of the present invention, the method further includes the step of determining which of the at least one circuit breaker is electrically connected to the electrical outlet.

In a further embodiment of the first aspect of the present invention, the determining step further includes the steps of locating the electrical circuit breaker panel, and turning off and on the at least one circuit breaker to determine which of the at least one circuit breaker is electrically connected to the electrical outlet.

A second aspect of the present invention is a method for identifying which electrical outlets are electrically connected to a circuit breaker, including the steps of: providing an electrical outlet faceplate cover having a plurality of electrical outlet openings and a fastener located between the plurality of electrical outlet openings such that the electrical outlet faceplate cover is located over an electrical outlet; providing a circuit breaker panel having at least one circuit breaker located on the circuit breaker panel; providing a near field communications tag located on a back side of the electrical outlet faceplate cover, wherein the near field communications tag is operatively connected to the fastener such that the near field communications tag is capable of containing information related to which of the at least one circuit breaker is electrically connected to the electrical outlet; providing a remote device with access to a database; bringing the remote device into close proximity to the electrical outlet, wherein the remote device can read the information contained on the near field communications tag related to which of the at least one circuit breaker is electrically connected to the electrical outlet; rendering a user interface through which a user, via the remote device, can define a relationship between the electrical outlet and the at least one circuit breaker; receiving the user defined relationship between the electrical outlet and the at least one circuit breaker in the database via the remote device; creating, in a database, the user defined relationship between the electrical outlet and the at least one circuit breaker; and providing access to execute a query regarding the user defined relationship between the electrical outlet and the at least one circuit breaker.

In one embodiment of the second aspect of the present invention, the method further includes the step of determining which of the at least one circuit breaker is electrically connected to the electrical outlet.

In another embodiment of the second aspect of the present invention, the method further includes the step of recording which of the at least one circuit breaker is electrically connected to the electrical outlet.

In a further embodiment of the second aspect of the present invention, the determining step further includes the steps of locating the electrical circuit breaker panel, and turning off and on the at least one circuit breaker to determine which of the at least one circuit breaker is electrically connected to the electrical outlet.

A third aspect of the present invention is a method for monitoring an electrical state of a circuit breaker which is electrically connected to an electrical outlet, including the steps of: providing an electrical outlet faceplate cover having a plurality of electrical outlet openings and a fastener located between the plurality of electrical outlet openings such that the electrical outlet faceplate cover is located over an electrical outlet; providing a circuit breaker panel having at least one circuit breaker located on the circuit breaker panel; providing a near field communications tag located on a back side of the electrical outlet faceplate cover, wherein the near field communications tag is operatively connected to the fastener such that the near field communications tag is capable of containing information related to which of the at least one circuit breaker is electrically connected to the electrical outlet; storing information related to which of the at least one circuit breaker is electrically connected to the electrical outlet in a database; providing a remote device with access to the database; rendering a user interface through which a user, via the remote device, can define the relationship between the electrical outlet and the at least one circuit breaker; receiving the user defined relationship between the electrical outlet and the at least one circuit breaker in the database via the remote device; creating, in a database, the user defined relationship between the electrical outlet and the at least one circuit breaker; providing access to execute a query regarding the user defined relationship between the electrical outlet and the at least one circuit breaker; determining an electrical state of the at least one circuit breaker; and providing, via the remote device, an electrical state of the at least one circuit breaker.

In one embodiment of the third aspect of the present invention, the method further includes the step of bringing the remote device into close proximity to the electrical outlet, wherein the remote device can access the information contained on the near field communications tag.

In another embodiment of the third aspect of the present invention, the method further includes the steps of: rendering the user interface through which the user, via the remote device, can define a circuit breaker category, wherein the circuit breaker category specifies a relationship between the electrical outlet and the at least one circuit breaker; receiving the user defined circuit breaker category in the database via the remote device; creating, in a database, the user defined circuit breaker category based upon the relationship between the electrical outlet and the at least one circuit breaker; and providing access to execute a query regarding the user defined circuit breaker category through the remote device.

In a further embodiment of the third aspect of the present invention, the method further includes the step of determining which of the at least one circuit breaker is electrically connected to the electrical outlet.

In a still another embodiment of the third aspect of the present invention, the determining step further includes the steps of locating the electrical circuit breaker panel, and turning off and on the at least one circuit breaker to determine which of the at least one circuit breaker is electrically connected to the electrical outlet.

In a yet further embodiment of the third aspect of the present invention, the method further includes the step of recording which of the at least one circuit breaker is electrically connected to the electrical outlet.

The preferred identification tag that can be used to identify which electrical breaker in the electrical circuit breaker box or panel is electrically connected to and controls that particular electrical outlet (or electrical circuit/electrical switch), according to various embodiments of the present invention, offers the following advantages: ease of use; lightness in weight; the ability to allow the information to be accessed through a device with near field communications (NFC) capabilities without removing the cover faceplate; the ability to use the tag in a commercial or residential building; durability; improved ability to identify which electrical breaker in the electrical circuit breaker box or panel is electrically connected to and controls that particular electrical outlet (or electrical circuit/electrical switch); the ability to attach the tag to an electrical outlet; the ability to attach the tag to an electrical switch faceplate; the ability to attach the tag to an electrical switch; reduced downtime when replacing an electrical switch, electrical outlet, electrical circuit and/or circuit breaker; the ability to create a list of electrical outlets/electrical switches associated with the identification tag(s); the ability to monitor and/or control a circuit breaker through the use of the identification tag(s); and the ability to manage users with which identification tag(s) are associated. In fact, in many of the preferred embodiments, these advantages are optimized to an extent that is considerably higher than heretofore achieved in prior, known identification systems and devices used to identify which circuit breaker controls a specific circuit (or electrical outlet/electrical switch) in a residential or commercial building.

BRIEF DESCRIPTION OF THE DRAWINGS

The above-mentioned features and steps of the invention and the manner of attaining them will become apparent, and the invention itself will be best understood by reference to the following description of the embodiments of the invention in conjunction with the accompanying drawings, wherein like characters represent like parts throughout the several views and in which:

FIG. 18 is a flow chart that illustrates the method of creating a list of electrical outlets or circuit breakers (or electrical circuits/electrical switches) by a predetermined category, according to the present invention;

FIGS. 21a-21d are flow charts that illustrate the methods of managing users of the identification tag system, according to the present invention.

DETAILED DESCRIPTION OF INVENTION

In order to address the shortcomings of the prior known identification systems and devices used to identify which circuit breaker controls a specific circuit (or electrical outlet/electrical switch) in a residential or commercial building, reference is made to FIGS. 1-8 where there is illustrated near field communications (NFC) identification tags 50, 250 and 350 that can be placed on or near an electrical outlet (or electrical circuit) or electrical switch such that the NFC identification tags 50, 250 and 350 can be used to identify which electrical breaker in the electrical circuit breaker box or panel is electrically connected to and controls that particular electrical outlet (or electrical circuit) or electrical switch.

Electrical Outlet Faceplate Identification Tag System

Figures 1, 4:
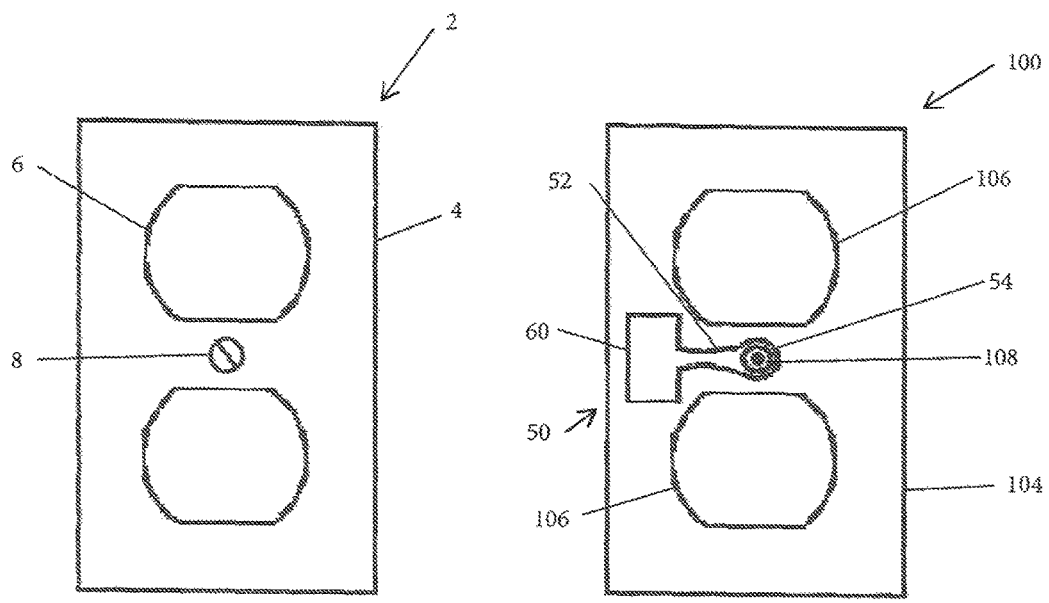
FIG. 1 is a schematic, front view illustration of an electrical outlet face plate, constructed according to the prior art.
FIG. 4 is a schematic, rear view illustration of the electrical outlet face plate of FIG. 1 with the near-field communications (NFC) tag attached, constructed according to the present invention.
Figure 3A:
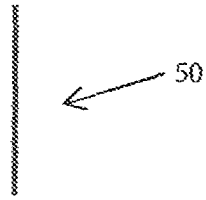
FIGS. 3a and 3b are schematic, side view illustrations of the near-field communications (NFC) tag of FIGS. 2a and 2b, respectively, constructed according to the present invention.

With reference to FIG. 1, there is illustrated a conventional faceplate 2 that is used to conventionally cover an electrical outlet that can be commonly found in commercial and residential buildings. Typically, faceplate 2 includes faceplate cover 4, electrical outlet openings 6 and fastener 8. It is to be understood that electrical outlet openings 6 allow electrical outlets such as electrical outlets 204, as those shown in FIGS. 5 and 6, to be located within the electrical outlet openings 6. Also, it is to be understood that fastener 8 is conventionally used to secure the faceplate 2 to the electrical outlet. Finally, well known, conventional faceplate 2 typically is constructed of many different types of suitable, durable materials.

Figure 2A:
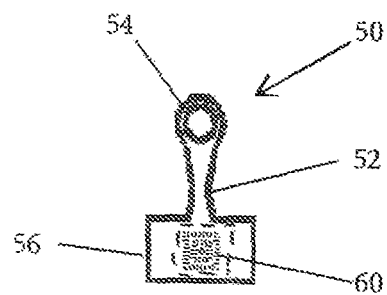
FIGS. 2a and 2b are schematic, front view illustrations of a near-field communications (NFC) tag with the NFC tag being hidden (FIG. 2a) and being shown in a cut-away view (FIG. 2 b), constructed according to the present invention.
Figure 2B:
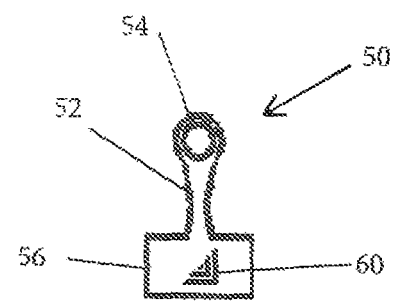
Figure 3B:
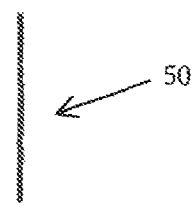

As shown in FIGS. 2a, 2b, 3a and 3b, there is illustrated near-field communications (NFC) tag 50. NFC tag 50 includes, in part, tag extension 52, tag opening 54, near field communications tag holder 56, and near field communications tags 60. It is to be understood that tag extension 52 and near field communications tag holder 56, preferably, are constructed of any suitable, durable, non-electrically conducting polymeric material. It is to be understood that opening 54 is conventionally formed at one end of NFC tag 50. It is to be further understood that near field communications tags 60 are conventionally retained within near field communications tag holder 56. It is to be further understood that FIG. 2b shows a cut-away view of the near field communications tag 60 being located within a portion of the near field communications tag holder 56.

It is to be understood that the near field communications tags 60 may be pre-programmed so one simply has to connect to NFC tag 50 to a conventional device with NFC capabilities so that the device can write to the near field communications tags 60 whatever information is desired. In this manner, the near field communications tags 60 would then have the data stored and the data could then be accessed later by the device or any other suitable NFC capable device, if needed.

Regarding FIG. 4, there is illustrated electrical outlet faceplate identification tag system 100. As shown in FIG. 4, electrical outlet faceplate identification tag system 100 includes, in part, faceplate cover 104, electrical outlet openings 106, fastener 108 and NFC tag 50. It is to be understood that electrical outlet openings 106 and fastener 108 function in substantially the same manner as electrical outlet openings 6 and fastener 8 in FIG. 1. It is to be further understood that faceplate cover 104, preferably, is constructed of any suitable, durable non-electrically conducting polymeric material. Furthermore, it is to be understood that faceplate cover 104 can be located over an electrical outlet such as electrical outlet 204.

A unique aspect of the present invention is the use of NFC tag 50 in electrical outlet faceplate identification tag system 100. As will be discussed in greater detail later, NFC tag 50 is attached to the back of faceplate cover 104 by locating tag opening 54 over fastener 108 such that NFC tag 50 is fixedly retained on the back of faceplate cover 104. It is to be understood that NFC tag 50 can also be located between the faceplate cover 104 and the electrical outlet 204. In particular, the NFC tag 50 is located adjacent to a back side of the faceplate cover 104, wherein the NFC tag 50 can be removably detained on the back side of the faceplate cover 104. In this manner, NFC tag 50 can be removably detained on the back of faceplate cover 104 by locating tag opening 54 over fastener 108 such that NFC tag 50 can be removably detained on the back of faceplate cover 104. It is to be further understood that NFC tag 50 is then oriented such that near field communications tags 60 are located between the electrical outlet openings 106. Once the NFC tag 50 has been properly retained on the back of faceplate cover 104, electrical outlet faceplate identification tag system 100 can be placed over a conventional electrical outlet (not shown) or electrical outlet 204 so that the NFC tag 50 can be used to identify which electrical breaker (404,406) in the electrical circuit breaker box or panel 400 (FIG. 9) is electrically connected to and controls that particular electrical outlet (or electrical circuit/electrical switch), as will be discussed in greater detail later. It is to be understood that the NFC tag 50 may also be conventionally embedded within the structure of the faceplate cover 104 with the important factor being that the NFC tag 50 must be able to be read by a NFC capable reader. Furthermore, it is to be understood that the NFC tag 50 may also be conventionally embedded within or attached to conventional electrical appliances, such as lamps, fans, ovens, or the like with the important factor being that the NFC tag 50 must be able to be read by a NFC capable reader.

It is important to note that the faceplate cover 104 in this embodiment of the present invention must be constructed of any suitable, durable, non-electrically conductive material (anything except metal). If the faceplate cover 104 in this embodiment of the present invention were to be made of metal, for example, the information stored on NFC tag 50 would not be able to be accessed by the device used to read the information stored on the near field communications tags 60.

Electrical Outlet Identification Tag System

Figure 6:
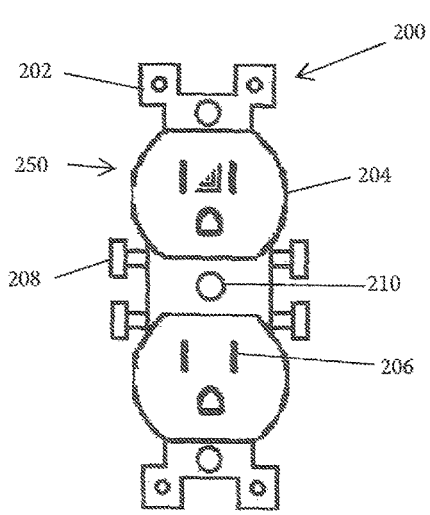
FIG. 6 is a front view illustration of the electrical outlet of FIG. 5 with a cut-away of one of the electrical outlets, showing the location of the near-field communications (NFC) tag embedded within one of the electrical outlets, constructed according to the present invention.
Figure 5:
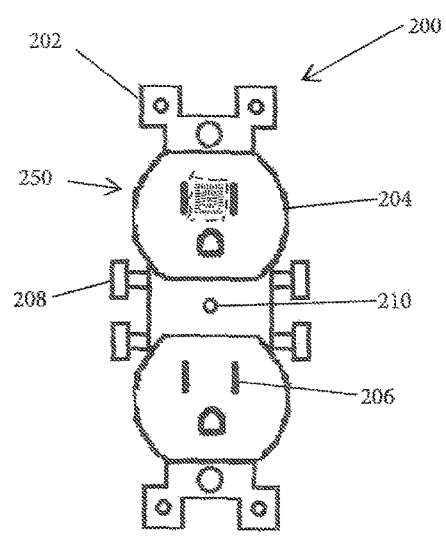
FIG. 5 is a front view illustration of an electrical outlet with a near-field communications (NFC) tag embedded within one of the electrical outlets, constructed according to the present invention.

With reference to FIGS. 5 and 6, there is illustrated electrical outlet tag system 200. As shown in FIGS. 5 and 6, electrical outlet identification tag system 200 includes, in part, conventional electrical outlet bracket 202, electrical outlets 204, conventional electrical outlet plug openings 206, conventional electrical connectors 208, conventional faceplate connector 210 and NFC tag 250. It is to be understood that electrical outlet bracket 202 is conventionally used to fixedly secure the electrical outlet identification tag system 200 to a wall or other rigid structure, as is well known in the electrical arts. Also, electrical outlet plug openings 206 are used in conjunction with conventional electrical plugs (not shown) to allow the desired electrical device to receive electricity from electrical outlets 204. Finally, faceplate connector 210 is used in conjunction with fastener 8, 108 in order to fixedly secure the faceplate 4, 104, respectively, to the electrical outlet identification tag system 200.

Another unique aspect of the present invention is the use of NFC tag 250 in electrical outlet identification tag system 200. As will be discussed in greater detail later, NFC tag 250 is conventionally located within one or both of the electrical outlets 204, as shown in FIG. 6 such that NFC tag 250 is fixedly retained within one or both of the electrical outlets 204. In particular, NFC tag 250, preferably, is located a short distance under the surface of one or both of the electrical outlets 204. It is to be understood that NFC tag 250 should be located under the surface of one or both of the electrical outlets 204 but at a distance that allows NFC tag 250 to be read by a conventional NFC tag reader, as will be discussed in greater detail later. Also, the size and shape of NFC tag 250 should be such that NFC tag 250 is able to be properly located in the area between electrical outlet plug openings 206, as shown in FIG. 6. Once the NFC tag 250 has been properly retained within the surface of one or both of the electrical outlets 204, a conventional electrical outlet faceplate 4 can be conventionally secured over the electrical outlets 204 so that the NFC tag 250 can be used to identify which electrical breaker (404,406) in the electrical circuit breaker box or panel 400 (FIG. 9) is electrically connected to and controls that particular electrical outlet (or electrical circuit), as will be discussed in greater detail later.

Another unique aspect of the present invention is that electrical outlet identification tag system 200 allows the NFC information on NFC tag 250 to be accessed through a conventional device with near field communications (NFC) capabilities such as a mobile communications device without removing the face plate 4 (FIG. 1). Of importance here is that because the NFC tag 250 is located within the electrical outlet 204, the mobile communications device is still able to send or receive a NFC signal from NFC tag 250 even if the electrical outlet identification tag system 200 is located behind a metal cover plate.

Electrical Switch Identification Tao System

Figure 7:
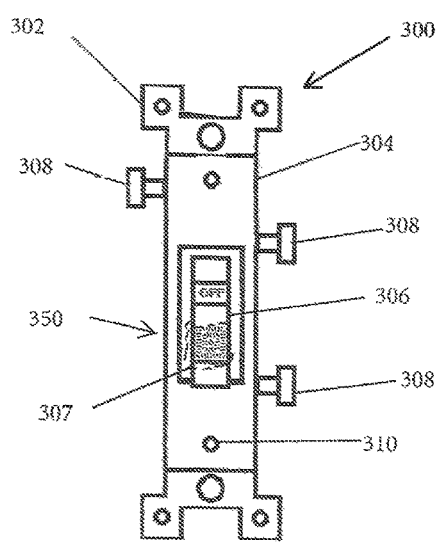
FIG. 7 is a front view illustration of an electrical switch with a near-field communications (NFC) tag embedded within the switch paddle, constructed according to the present invention.
Figure 8:
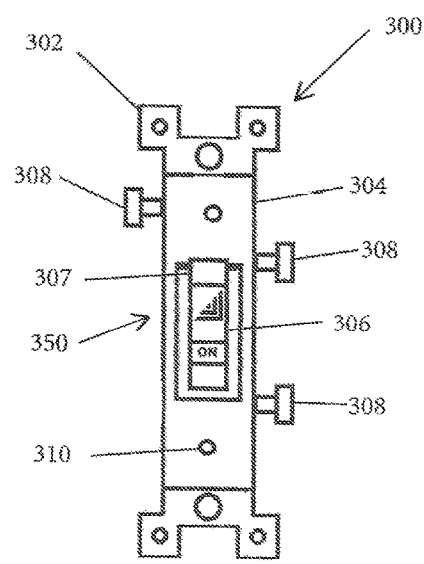
FIG. 8 is a front view illustration of the electrical switch of FIG. 7 with a cut-away of the electrical switch paddle, showing the location of the near-field communications (NFC) tag embedded within the switch paddle, constructed according to the present invention.

With reference to FIGS. 7 and 8, there is illustrated electrical switch identification tag system 300. As shown in FIGS. 7 and 8, electrical switch identification tag system 300 includes, in part, conventional electrical switch bracket 302, conventional electrical switch body 304, electrical switch 306, an electrical switch paddle 307, conventional electrical connectors 308, conventional faceplate connectors 310 and NFC tag 350. It is to be understood that electrical outlet bracket 302 is conventionally used to fixedly secure the electrical switch identification tag system 300 to a wall or other rigid structure, as is well known in the electrical arts. Also, faceplate connector 310 is used in conjunction with fasteners (not shown) in order to fixedly secure a conventional electrical switch faceplate (not shown) to the electrical switch identification tag system 300.

Another unique aspect of the present invention is the use of NFC tag 350 in electrical switch identification tag system 300. As will be discussed in greater detail later, NFC tag 350 is conventionally located within electrical switch paddle 307, as shown in FIG. 8 such that NFC tag 350 is fixedly retained in the electrical switch paddle 307. In particular, NFC tag 350, preferably, is located a short distance under the surface of electrical switch paddle 307. It is to be understood that NFC tag 350 should be located under the surface of electrical switch paddle 307 but at a distance that allows NFC tag 350 to be read by a conventional NFC tag reader, as will be discussed in greater detail later. Also, the size and shape of NFC tag 350 should be such that NFC tag 350 is able to be properly located in electrical switch paddle 307, as shown in FIG. 8. Once the NFC tag 350 has been properly retained within the electrical switch paddle 307, a conventional electrical switch faceplate (not shown) can be conventionally secured over the electrical switch 306 and electrical switch paddle 307 so that the NFC tag 350 can be used to identify which electrical breaker (404,406) in the electrical circuit breaker box or panel 400 (FIG. 9) is electrically connected to and controls that particular electrical switch 306, as will be discussed in greater detail later.

Another unique aspect of the present invention is that electrical switch identification tag system 300 allows for the NFC information to be accessed through a conventional device with near field communications (NFC) capabilities such as a mobile communications device without removing the face plate 4 (FIG. 1). Of importance here is that because the NFC tag 350 is located within the electrical switch paddle 307, the mobile communications device is still able to send or receive the NFC signal even if the NFC tag 350 is located behind a metal cover plate.

Electrical Outlet Faceplate Identification Tag System

Figures 9, 10:
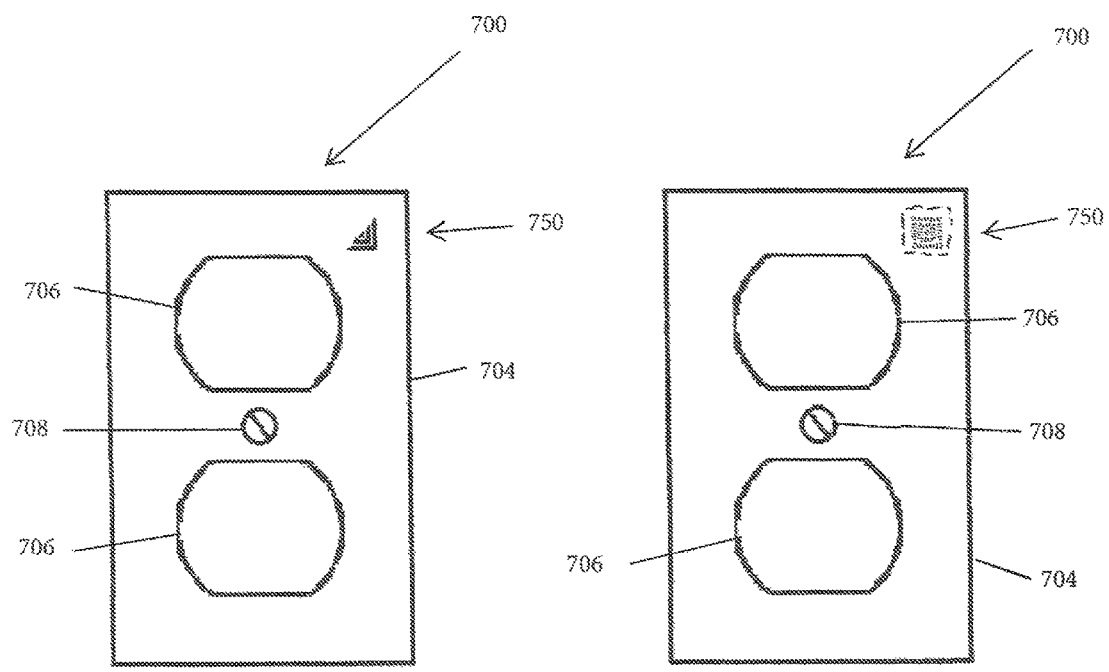
FIG. 9 is a front view illustration of an electrical outlet face plate with a near-field communications (NFC) tag embedded within the electrical outlet face plate, constructed according to the present invention.
FIG. 10 is a front view illustration of the electrical outlet face plate of FIG. 9 with a cut-away of the near-field communications (NFC) tag shown as being embedded within the electrical outlet face plate, constructed according to the present invention.
Figure 11:
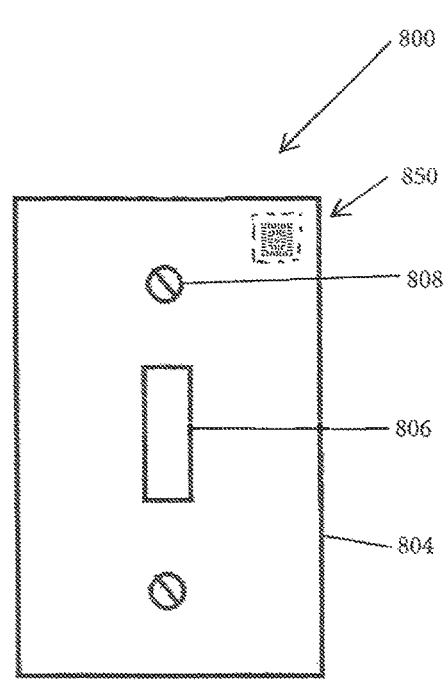
FIG. 11 is a front view illustration of an electrical switch face plate with a near-field communications (NFC) tag embedded within the electrical switch face plate, constructed according to the present invention.

Regarding FIGS. 10 and 11, there is illustrated electrical outlet faceplate identification tag system 700. As shown in FIGS. 10 and 11, electrical outlet faceplate identification tag system 700 includes, in part, faceplate cover 704, electrical outlet openings 706, fastener 708 and NFC tag 750. It is to be understood that electrical outlet openings 706 and fastener 708 function in substantially the same manner as electrical outlet openings 6 and fastener 8 in FIG. 1. It is to be further understood that faceplate cover 704, preferably, is constructed of any suitable, durable non-electrically conducting material (anything except metal). Furthermore, it is to be understood that faceplate cover 704 can be located over an electrical outlet such as electrical outlet 204.

A unique aspect of the present invention is the use of NFC tag 750 in electrical outlet faceplate identification tag system 700. As will be discussed in greater detail later, NFC tag 750 is conventionally embedded within a portion of faceplate cover 704. It is to be understood that electrical outlet faceplate identification tag system 700 can be placed over a conventional electrical outlet (not shown) or electrical outlet 204 so that the NFC tag 750 can be used to identify which electrical breaker (404,406) in the electrical circuit breaker box or panel 400 (FIG. 13) is electrically connected to and controls that particular electrical outlet (or electrical circuit/electrical switch), as will be discussed in greater detail later.

It is important to note that the faceplate cover 704 in this embodiment of the present invention must be constructed of any suitable, durable, non-electrically conductive material (anything except metal). If the faceplate cover 704 in this embodiment of the present invention were to be made of metal, for example, the information stored on NFC tag 750 would not be able to be accessed by the device used to read the information stored on the near field communications tag 750.

Electrical Switch Faceplate Identification Tag System

Figure 12:
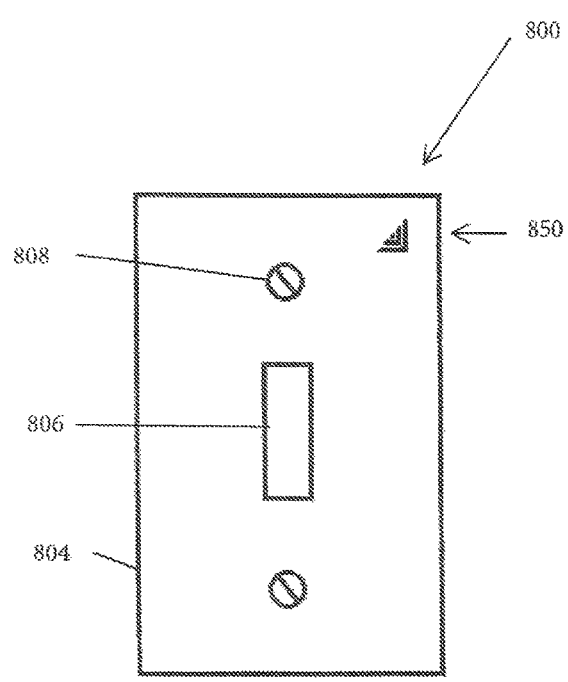
FIG. 12 is a front view illustration of the electrical switch face plate of FIG. 11 with a cut-away of the near-field communications (NFC) tag shown as being embedded within the electrical switch face plate, constructed according to the present invention.

Regarding FIGS. 11 and 12, there is illustrated electrical switch faceplate identification tag system 800. As shown in FIGS. 11 and 12, electrical switch faceplate identification tag system 800 includes, in part, faceplate cover 804, electrical switch opening 806, fasteners 808 and NFC tag 850. It is to be understood that electrical switch opening 806 can be placed over an electrical switch such as the electrical switch shown in FIGS. 7 and 8. Also, fasteners 808 can be used to conventionally secure faceplate cover 804 to an electrical switch such as the electrical switch shown in FIGS. 7 and 8. It is to be further understood that faceplate cover 804, preferably, is constructed of any suitable, durable non-electrically conducting material (anything except metal).

A unique aspect of the present invention is the use of NFC tag 850 in electrical switch faceplate identification tag system 800. As will be discussed in greater detail later, NFC tag 850 is conventionally embedded within a portion of faceplate cover 804. It is to be understood that electrical switch faceplate identification tag system 800 can be placed over a conventional electrical switch (not shown) or electrical switch base 304 so that the NFC tag 850 can be used to identify which electrical breaker (404,406) in the electrical circuit breaker box or panel 400 (FIG. 13) is electrically connected to and controls that particular electrical outlet (or electrical circuit/electrical switch), as will be discussed in greater detail later.

It is important to note that the faceplate cover 804 in this embodiment of the present invention must be constructed of any suitable, durable, non-electrically conductive material (anything except metal). If the faceplate cover 804 in this embodiment of the present invention were to be made of metal, for example, the information stored on NFC tag 850 would not be able to be accessed by the device used to read the information stored on the near field communications tag 850.

Electrical Circuit Breaker Box or Panel Module

Figure 13:
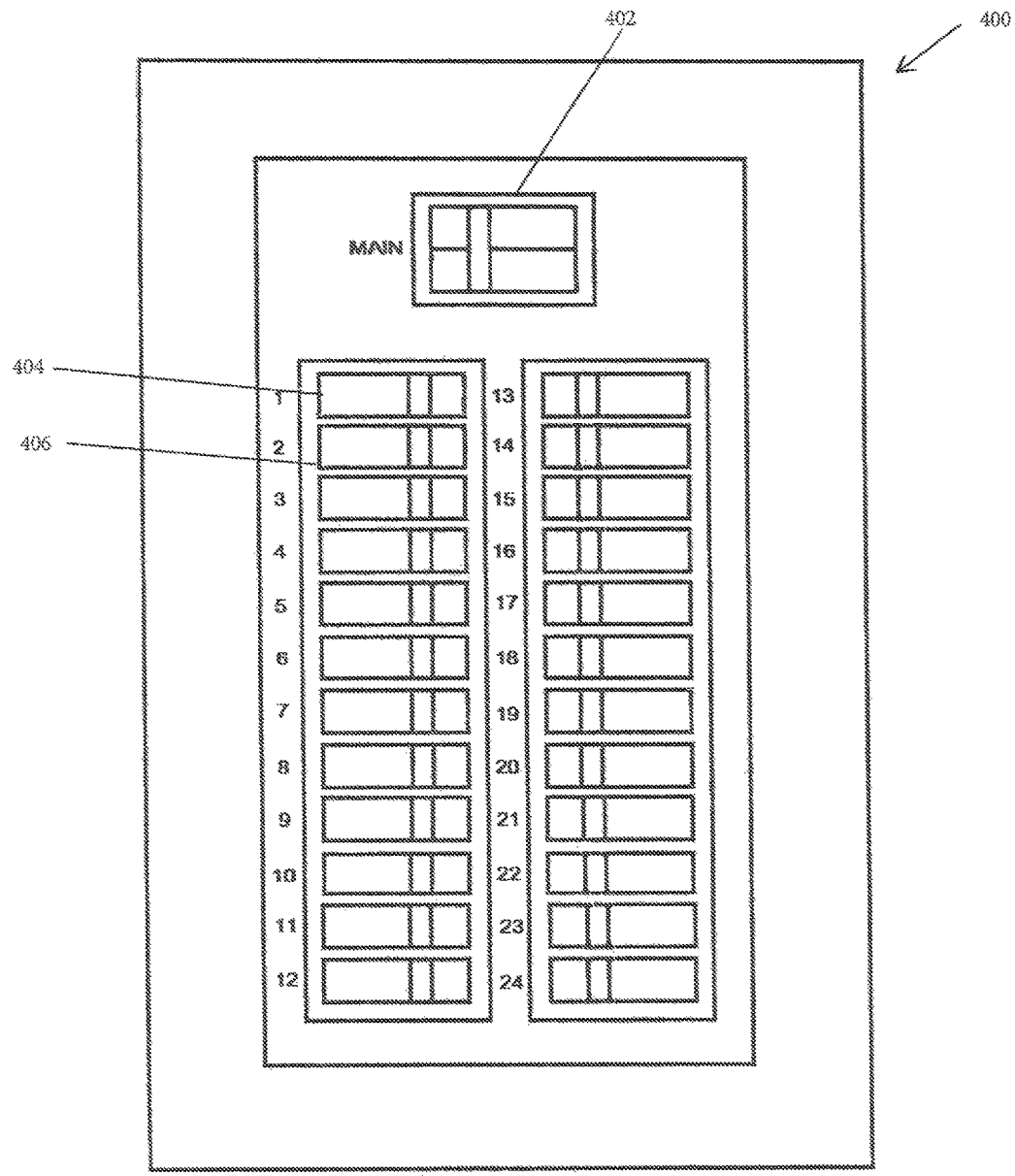
FIG. 13 is a front view of a main circuit breaker panel for use with the near-field communications (NFC) tag of FIGS. 2, 6, 8, 10 and 12.

With reference to FIG. 13, there is illustrated conventional electrical circuit breaker box or panel 400. As shown in FIG. 13, conventional electrical circuit breaker box or panel 400 includes, in part, conventional main circuit breaker 402 and conventional circuit breakers 404 and 406.

It is to be understood that while the present invention has been described for use with electrical outlets and/or electrical switches, other uses for the present invention include identifying and controlling landline telephone jacks, cable connections, electrical switches, WIFI hotspots, motion sensors, light sensors and anything that is part of an electrical circuit, particularly lights and appliances.

Figure 14:
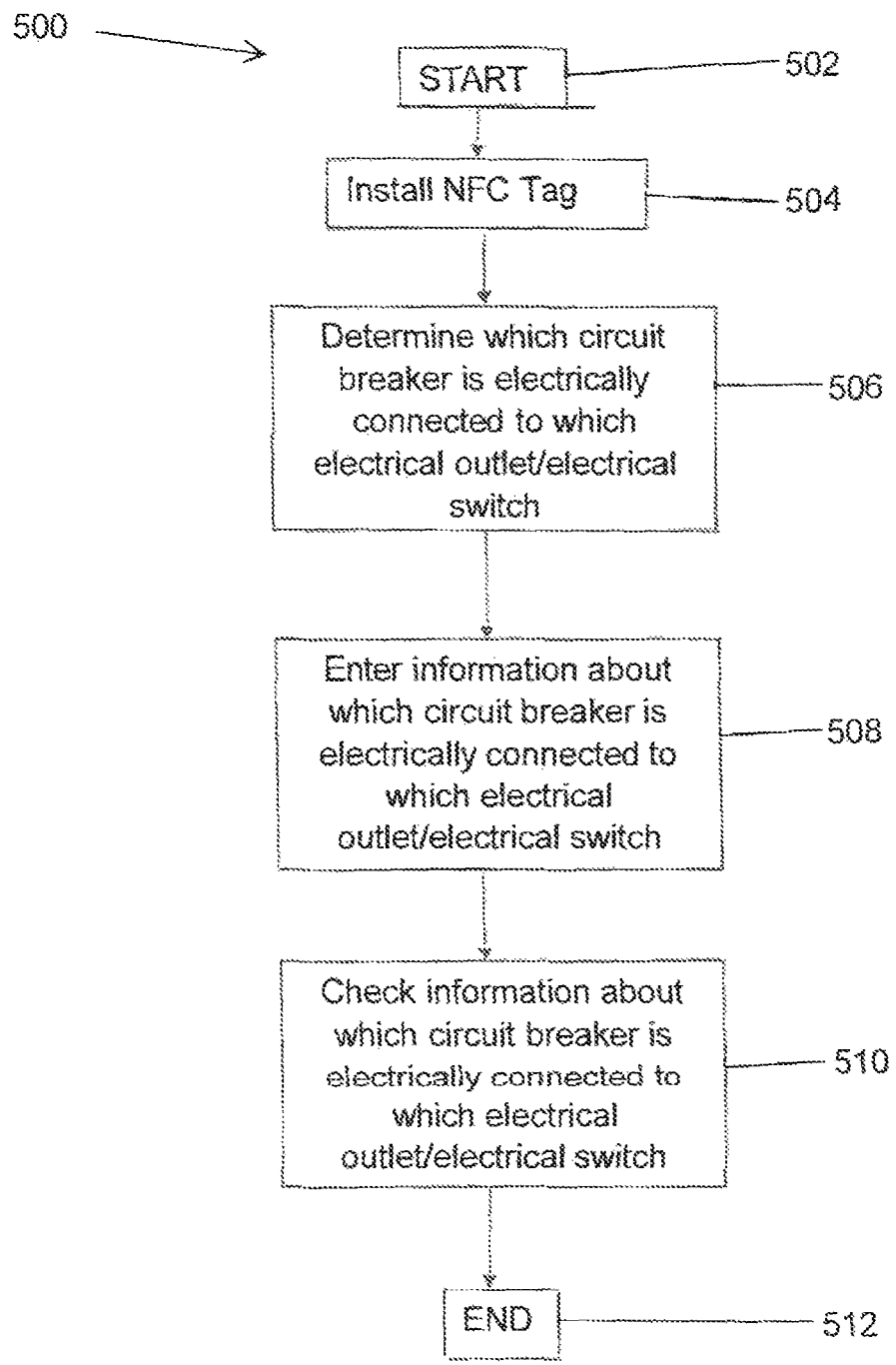
FIG. 14 is a flow chart that illustrates the method of identifying which electrical outlet (or electrical circuit/electrical switch) is electrically connected to and controlled by a particular electrical circuit breaker in the electrical circuit breaker box or panel, according to the present invention.

Operation of Electrical Outlet Faceplate Identification Tag System/Electrical Outlet Identification Tag System and Electrical Switch Identification Tag System
Circuit Breaker Identification With respect to the circuit breaker identification operation 500 of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the circuit breaker operation 500 begins with the start step 502 (FIG. 14) and the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user will then conventionally determine which circuit breaker is electrically connected to that particular electrical outlet that the electrical outlet faceplate identification tag system 100 is attached to, as shown in step 506. For example, the end user may have to go to the location of the electrical circuit breaker box or panel 400 and turn off/tom on various circuit breakers to determine which circuit breaker is electrically connected to that particular electrical outlet that the electrical outlet faceplate identification tag system 100 is attached to. In some instances, the various circuit breakers may already have markings or other forms of identification that signify what electrical outlets are connected to that particular circuit breaker; however, the present invention solves this problem if the circuit breakers are not marked or do not have any legible indication as to what electrical circuits are electrically connected to that particular circuit breaker.

With respect to step 508, after it has been determined which electrical outlets and/or electrical switches are electrically connected to a particular circuit breaker, the end user then conventionally enters (or records) this information into a database by using an application that has been downloaded onto the end user's mobile device, tablet or other similar mobile communications device. For example, it may be determined that the electrical outlets/electrical switches in the living room of the end user's residence are electrically connected to circuit breaker 404 (FIG. 13) and that the electrical outlets/electrical switches in the guest bed room of the end user's residence are electrically connected to circuit breaker 406. In this example, the end user enters the information that circuit breaker 404 is electrically connected/associated with the electrical outlets/electrical switches in the living room. The end user then enters the information that circuit breaker 406 is electrically connected/associated with the electrical outlets/electrical switches in the guest bed room. It is also to be understood that step 508 may be completed without the application that has been downloaded onto the end user's mobile device, tablet or other similar mobile communications device. In this instance, the end user simply scans the NFC tag. The NFC reader in the NFC capable device will display a web page showing information such as a description, room name, and photograph of the particular electrical outlets and/or electrical switches and the circuit breaker electrically connected to that particular electrical outlet and/or electrical switch will be displayed, and the displayed information is associated with the tag's ID located on the particular electrical outlets and/or electrical switches (and such information would also be present in the application downloaded to the end user's device). The end user then conventionally enters (or records) the information about which electrical outlets and/or electrical switches are electrically connected to a particular circuit breaker into a database and the information is associated with the tag's ID located on the particular electrical outlets and/or electrical switches.

It is to be understood that the NFC tag 50, when read by a conventional device such as the end user's mobile device, tablet or other similar mobile communications device, the device will open an application which will contain all the information stored on that NFC tag 50. For example, if there is a cover plate 104 with a NFC tag 50 that was conventionally labeled "tag 404", by holding the device within range of the NFC tag 50, a window would open on the end user's end user's mobile device, tablet or other similar mobile communications device. This window would have the information on the NFC tag 50, in this case, that would be the number 404, along with what electrical outlets/electrical switches/electrical circuits are electrically connected to breaker 404. It is to be understood that the information on the NFC tag 50 could also describe light fixtures and appliances that are electrically connected to a particular breaker.

The tag will come pre-programmed with a globally unique identifier (GUID) and additional code to link directly to either an application or a website where extended information can be stored and aggregated across all tags located in a building. The mobile device can also store information for the connected circuit directly on the tag for use when access to the application and/or the internet is unavailable. When the end user's mobile device, tablet or other similar mobile communications device comes into range of the NFC tag 50, the end user's mobile device, tablet or other similar mobile communications device conventionally reads the GUID and opens the application on the end user's mobile device, tablet or other similar mobile communications device. A user then would enter information into the app and the app links the information with the GUID on each NFC tag 50.

In order to check that the information regarding the electrical connections between the various electrical outlets/electrical switches located within the end user's residence has been correctly matched up with the circuit breaker that is actually connected to that particular electrical outlet/electrical switch, as shown in step 510, the end user can go to the living room, for example. Once in the living room, the end user can then use a conventional NFC reader (not shown) located with the end user's mobile communication device (smartphone) to detect the NFC tag 50 located within the electrical outlet faceplate identification tag system 100. After the NFC tag 50 has been conventionally detected, the database in the end user's mobile communications device is conventionally accessed so that the circuit breaker that is electrically connected to the electrical outlet/electrical switch located in the living room is shown or otherwise displayed to the end user.

Using the previous example, the end user simply goes to the end user's living room and conventionally scans one of the electrical faceplates 104. Once the NFC reader in the end user's mobile communications device reads or otherwise interacts with the NFC tag 50 in the electrical outlet faceplate identification tag system 100, the database in the end user's mobile communications device is accessed and the circuit breaker number 404, for example, is displayed or otherwise shown to the end user. In this manner, the end user can cross-check which electrical outlet/electrical switch located in which rooms of a residence are electrically connected to which circuit breakers. It is to be understood that a list of other outlets, switches, fixtures, and appliances on that same circuit may also be displayed. At this point, the operation 500 ends, as shown in step 512.

It is to be understood that while the operation of the present invention has been described for use in a residential building, the present invention can also be used in commercial buildings.

It is to be further understood that for wiring a new house, the NFC tags 50 can be attached to cover faceplates 104 when they are being installed, and the corresponding electrical outlet/electrical switch for that circuit breaker is known.

Electrical Outlet/Electrical Switch Identification

Figure 15:
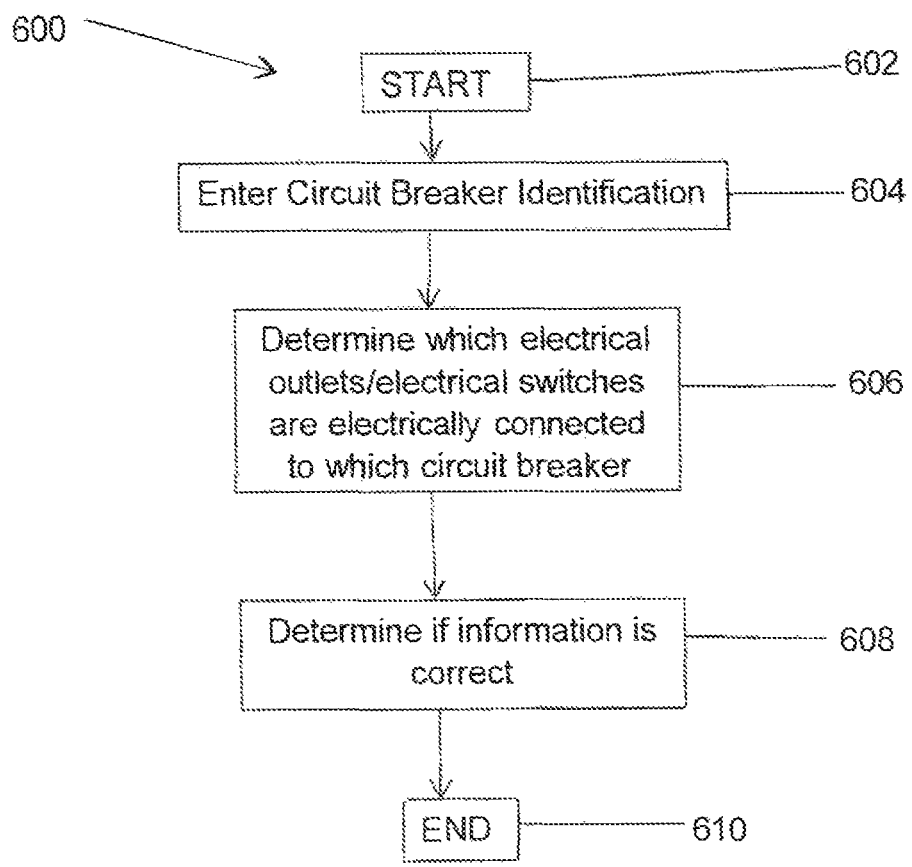
FIG. 15 is a flow chart that illustrates the method of identifying which electrical breaker in the electrical circuit breaker box or panel is electrically connected to and controls that particular electrical outlet (or electrical circuit/electrical switch), according to the present invention.

With respect to determining which electrical outlets/electrical switches are electrically connected to a particular circuit breaker, attention is now directed to FIG. 15. Assume that circuit breaker 404 has tripped due to an electrical short in the circuit controlled by breaker 404. In order to determine which electrical outlets/electrical switches are electrically controlled by breaker 404, the electrical outlet/electrical switch identification operation 600 starts at step 602.

As shown in step 604, the end user conventionally enters the circuit breaker identifier such as the circuit breaker number (404 in this example) into the end user's mobile communications device.

As discussed above, the application in the end user's mobile communications device will then access the database connected to the end user's mobile communication device to determine which electrical outlet/electrical switch is electrically connected to the defective circuit breaker, as shown in step 606. In this example, the end user's mobile communications device will then display or otherwise show which electrical outlets/electrical switches are electrically connected to the circuit controlled by breaker 404, as discussed earlier.

In order to check that the information regarding the electrical connections between the various electrical outlets/electrical switches located within the end user's residence has been correctly matched up with the circuit breaker that is actually connected to that particular electrical outlet/electrical switch, as shown in step 608, the end user can replace the defective circuit breaker 404. Once the electrical short in the circuit controlled by breaker 404 has been repaired, the end user can then conventionally turn on the circuit breaker 404 and then determine if the electrical outlets/electrical switches located within the end user's living room are now operating. At this point, the operation 600 ends, as shown in step 610.

Setting Up an Electrical Outlet/Electrical Switch

Figure 16:
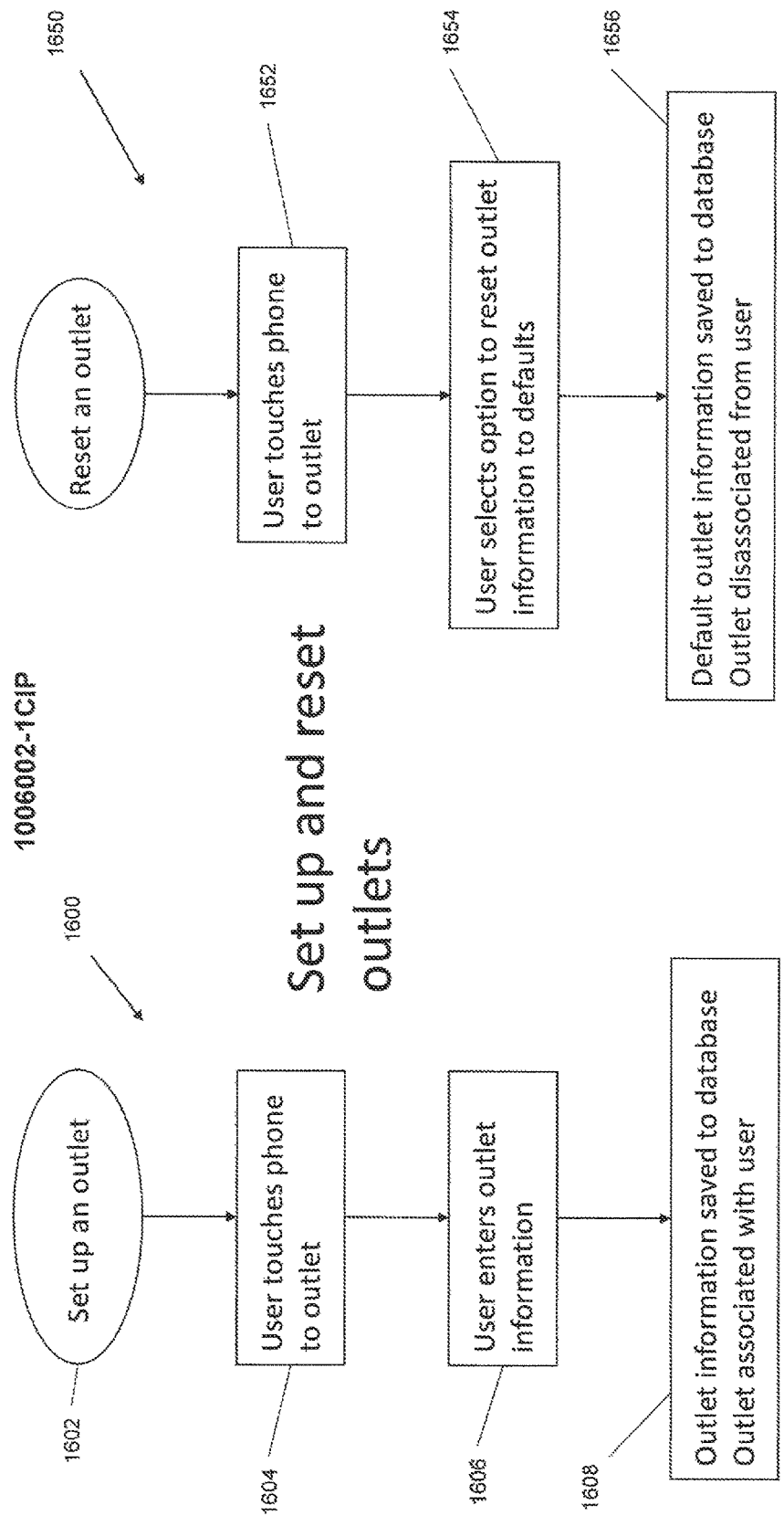
FIGS. 16a and 16b are flow charts that illustrate the methods of setting up and maintaining an electrical outlet (or electrical circuit/electrical switch), according to the present invention.

Regarding the operation 1600 of setting up an electrical outlet/electrical switch, attention is now directed to FIG. 16a. With respect to the operation 1600 of setting up the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 1600 of setting up an electrical outlet/electrical switch begins with the start step 1602 (FIG. 16a) and the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user will then touch or otherwise bring a conventional device such as the end user's mobile device into close proximity to the NFC tag 50 (step 1604). In this manner, an input screen (not shown) on the end user's device will appear so that the end user can then conventionally enter information about that particular NFC tag 50 into the input screen. More particularly, the end user may conventionally enter (or record) the information about the particular NFC tag 50 through the input screen into a database by using an application that has been downloaded onto the end user's mobile device (step 1606). The information about the particular NFC tag 50 is then conventionally entered into a database located on the end user's mobile device or located on a remote data storage system conventionally connected to the end user's mobile device (step 1608). For example, it may be determined that the electrical outlets/electrical switches in the living room of the end user's residence are electrically connected to circuit breaker 404 (FIG. 13) and that the electrical outlets/electrical switches in the guest bed room of the end user's residence are electrically connected to circuit breaker 406. In this example, the end user enters the information that circuit breaker 404 is electrically connected/associated with the electrical outlets/electrical switches in the living room. The end user then enters the information that circuit breaker 406 is electrically connected/associated with the electrical outlets/electrical switches in the guest bed room. It is also to be understood that step 1606 may be completed without the application that has been downloaded onto the end user's mobile device. In this instance, the end user simply scans the NFC tag. The NFC reader in the NFC capable device (such as the end user's mobile device) will display a web page showing information such as a description, room name, and photograph of the particular electrical outlets and/or electrical switches and the circuit breaker electrically connected to that particular electrical outlet and/or electrical switch will be displayed, and the displayed information is associated with the tag's ID located on the particular electrical outlets and/or electrical switches (and such information would also be present in the application downloaded to the end user's device). The end user can then conventionally enter information about that particular NFC tag 50 into the input screen. More particularly, the end user may conventionally enter (or record) the information about the particular NFC tag 50 through the input screen into a database and the information is associated with the tag's ID located on the particular electrical outlets and/or electrical switches.

It is to be understood that the NFC tag 50, when read by a conventional device such as the end user's mobile device, the device may also open an application on the end user's mobile device which will contain all the information stored on that NFC tag 50. For example, if there is a cover plate 104 with a NFC tag 50 that was conventionally labeled "tag 404", by holding the mobile device within range of the NFC tag 50, a window would open on the end user's mobile device. This window would have the information on the NFC tag 50, in this case, that would be the number 404, along with what electrical outlets/electrical switches/electrical circuits are electrically connected to breaker 404. It is to be understood that the information on the NFC tag 50 could also describe light fixtures and appliances that are electrically connected to a particular breaker.

It is to be understood that the NFC tag 50 may also come pre-programmed with a globally unique identifier (GUID) and additional code to link directly to either an application on the end user's mobile device or a website where extended information can be stored and aggregated across all tags located in a building. The mobile device can also store information for the connected circuit directly on the NFC tag 50 for use when access to the application and/or the internet is unavailable. When the end user's mobile device comes into range of the NFC tag 50, the end user's mobile device conventionally reads the GUID and opens the application on the end user's mobile device. The end user could then enter information into the application on the end user's mobile device and the application would then link the information with the GUID on each NFC tag 50.

Maintaining an Electrical Outlet/Electrical Switch

In order to reset an electrical outlet in electrical outlet faceplate identification tag system 100, for example, attention is now directed to FIG. 16*b*. The operation 1650 of maintaining an electrical outlet/electrical switch begins with the start step 1650 (FIG. 16*b*). The end user will then touch or otherwise bring a conventional device such as the end user's mobile device into close proximity to the NFC tag 50 (step 1652). In this manner, an input screen (not shown) on the end user's mobile device will appear so that the end user can then conventionally enter information about that particular NFC tag 50 into the input screen. In particular, the end user may conventionally enter (or record) the information about the particular NFC tag 50 into a database by using an application that has been downloaded onto the end user's mobile device. More particularly, the end user may select an option to reset information about a particular NFC tag 50 to a default setting (step 1654). The updated information about the particular NFC tag 50 is then conventionally entered into a database located on the end user's mobile device or located on a remote data storage system conventionally connected to the end user's mobile device (step 1656).

For example, it may be determined that initially the electrical outlets/electrical switches in the living room of the end user's residence are electrically connected to circuit breaker 404 (FIG. 13) but the electrical outlets/electrical switches in the living room were recently connected to circuit breaker 406. However, further electrical work in the living room required that the electrical outlets/electrical switches in the living room to be electrically re-connected back to circuit breaker 404. In this example, the end user touches the outlets/electrical switches in the living room and then enters the information that circuit breaker 404 has been electrically re-connected/associated with the electrical outlets/electrical switches in the living room. It is also to be understood that step 1654 may be completed without the application that has been downloaded onto the end user's mobile device. In this instance, the end user simply scans the NFC tag 50. The NFC reader in the NFC capable device will display a web page showing information such as a description, room name, and photograph of the particular electrical outlets and/or electrical switches and the circuit breaker electrically connected to that particular electrical outlet and/or electrical switch will be displayed, and the displayed information is associated with the tag's ID located on the particular electrical outlets and/or electrical switches (and such information would also be present in the application downloaded to the end user's device). Using the above example, the end user can then enter the information that circuit breaker 404 has been electrically re-connected/associated with the electrical outlets/electrical switches in the living room.

Reading Electrical Outlet/Electrical Switch Information

Figure 17:
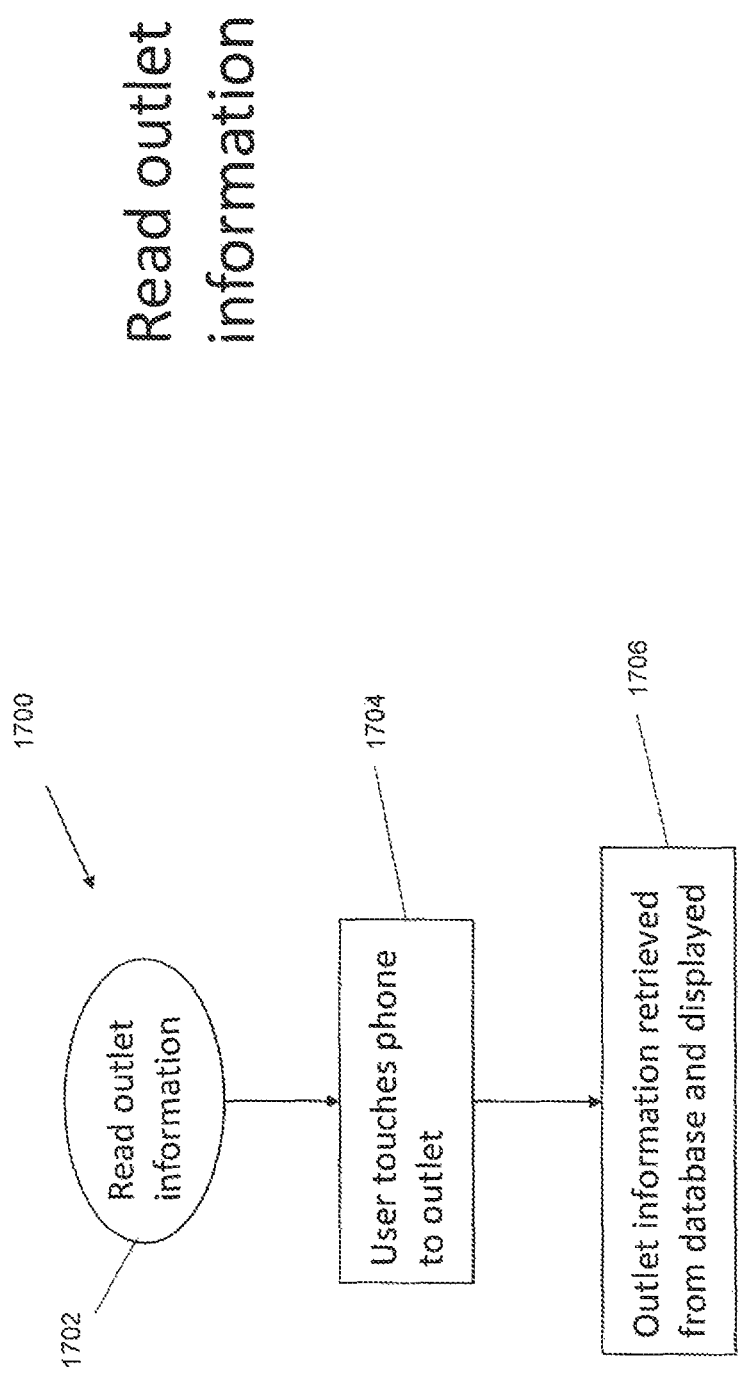
FIG. 17 is a flow chart that illustrates the method of reading electrical outlet (or electrical circuit/electrical switch) information, according to the present invention.

Regarding the operation 1700 of reading outlet information, attention is now directed to FIG. 17. With respect to the operation 1700 of reading outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 1700 of reading outlet information of an electrical outlet/electrical switch begins with the start step 1702 after the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user will then touch or otherwise bring a conventional device such as the end user's mobile device into close proximity to the NFC tag 50 (step 1704). In this manner, the information about the particular NFC tag 50 is then conventionally retrieved from a database through an application located on the end user's mobile device or located on a remote data storage system conventionally connected to the end user's mobile device (step 1706) and conventionally displayed on an input screen (not shown) on the end user's device so that the end user can then review the information about that particular NFC tag 50 on the input screen.

For example, it may be desired by the end user to determine which circuit breakers are electrically connected to the electrical outlets/electrical switches in the living room of the end user's residence, and which circuit breakers are electrically connected to the electrical outlets/electrical switches in the guest bed room of the end user's residence because the end user is going to remodel the living room and the guest bed room and needs to know which circuit breakers to turn off prior to the beginning of the remodeling project. In this example, the end user simply touches each of the electrical outlets/electrical switches in the living room and notes which circuit breakers they are electrically connected to (for example, circuit breaker 404 (FIG. 13)). The end user can then simply touch each of the electrical outlets/electrical switches in the guest bedroom and note which breakers they are electrically connected to (for example, circuit breaker 406). The end user can then turn off breakers 404 and 406 before starting work.

It is also to be understood that step 1706 may be completed without an application that has been downloaded onto the end user's mobile device. In this instance, the end user simply scans the NFC tag. The NFC reader in the NFC capable device will display a web page showing information such as a description, room name, and photograph of the particular electrical outlets and/or electrical switches and the circuit breaker electrically connected to that particular electrical outlet and/or electrical switch will be displayed, and the displayed information is associated with the tag's ID located on the particular electrical outlets and/or electrical switches (and such information would also be present in the application downloaded to the end user's device).

It is to be understood that the NFC tag 50, when read by a conventional device such as the end user's mobile device, the device may also open an application on the end user's mobile device which will contain all the information stored on that NFC tag 50. For example, if there is a cover plate 104 with a NFC tag 50 that was conventionally labeled "tag 404", by holding the device within range of the NFC tag 50, a window would open on the end user's mobile device. This window would have the information on the NFC tag 50, in this case, that would be the number 404, along with what electrical outlets/electrical switches/electrical circuits are electrically connected to breaker 404. It is to be understood that the information on the NFC tag 50 could also describe light fixtures and appliances that are electrically connected to a particular breaker.

It is to be understood that the NFC tag 50 may also come pre-programmed with a globally unique identifier (GUID) and additional code to link directly to either an application on the end user's mobile device or a website where extended information can be stored and aggregated across all tags located in a building. The mobile device can also store information for the connected circuit directly on the NFC tag 50 for use when access to the application and/or the internet is unavailable. When the end user's mobile device comes into range of the NFC tag 50, the end user's mobile device conventionally reads the GUID and opens the application on the end user's mobile device. The end user could then enter information into the application on the end user's mobile device and the application would then link the information with the GUID on each NFC tag 50.

Creating a Listing of Electrical Outlet/Electrical Switch Information by Category Regarding the operation 1800 of creating a listing of electrical outlet/electrical switch information by a category, attention is now directed to FIG. 18. With respect to the operation 1800 of creating a listing of electrical outlet/ electrical switch information by a category for the outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 1800 of creating a listing of electrical outlet/ electrical switch information by a category begins with the start step 1802 after the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user will then access the end user's mobile device. In this manner, an input screen (not shown) on the end user's device will appear so that the end user can then conventionally enter information about a particular category or categories that the end user would like to organize into the various electrical outlets/electrical switches (step 1802). It is to be understood that the end user can also set up (create) a variety of different categories based upon a variety of relationships between the electrical outlets/electrical switches and the circuit breakers. More particularly, the end user may conventionally enter (or record) the information about the particular category or categories into a database by using an application that has been downloaded onto the end user's mobile device or located on a remote data storage system conventionally connected to the end user's mobile device.

As shown in step 1804, the end user can choose to view which electrical outlets/electrical switches are associated with that particular category (step 1804). If the particular category has been previously created and stored in the database, the end user's device then will retrieve the desired information from the data base and display the particular category on the end user's mobile device and all of the electrical outlets/electrical switches and circuit breakers associated with that particular category (step 1806).

For example, it may be desired by the end user to determine which circuit breakers are electrically connected to the electrical outlets/electrical switches in the living room of the end user's, and which circuit breakers are electrically connected to the electrical outlets/electrical switches in the guest bed room of the end user's residence, because the end user is going to remodel the living room and the guest bed room and needs to know which circuit breakers to turn off prior to the beginning of the remodeling project. In this example, the end user has previously created a category for room location of each electrical outlet/electrical switch that was filled in when each electrical outlet/electrical switch in the home was set up (operation 1600). The end user can then view the electrical outlets/electrical switches located in the living room (and see that all of them are electrically connected to circuit breaker 404 in this example) and then view the electrical outlets/electrical switches located in the guest bedroom (and see that all of them are electrically connected to circuit breaker 406 in this example). In this manner, the end user can simply determine which circuit breakers are electrically connected to the electrical outlets/electrical switches in the living room (circuit breaker 404 in this example) and which circuit breakers are electrically connected to the electrical outlets/electrical switches in the guest bed room (circuit breaker 406 in this example) so the end user knows which breakers to turn off during the remodeling project.

Monitoring Circuit Breakers

Figures 19A, 19B:
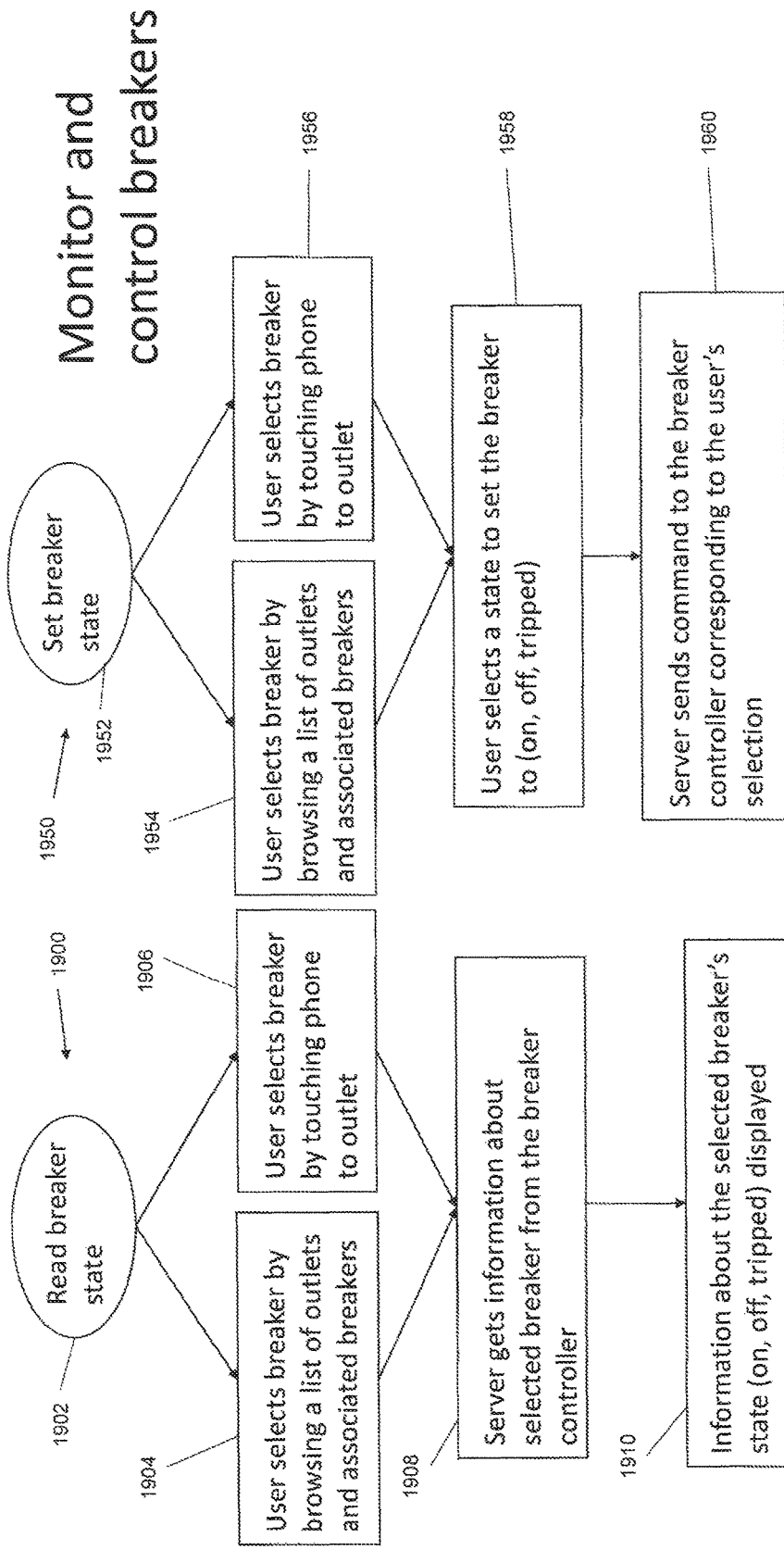
FIGS. 19a and 19b are flow charts that illustrate the methods of monitoring and controlling a circuit breaker, according to the present invention.

Regarding the operation 1900 of monitoring a circuit breaker, attention is now directed to FIG. 19a. With respect to the operation 1900 of monitoring a circuit breaker using the outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 1900 of monitoring a circuit breaker using the outlet information of an electrical outlet/electrical switch begins with the start step 1902 after the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user can get information about the electrical state of a particular circuit breaker (step 1902) by either touching or otherwise bringing a conventional device such as the end user's mobile device into close proximity to the NFC tag 50 (step 1906). In this manner, the electrical state information about the circuit breaker that it is connected to that particular NFC tag 50 is then conventionally retrieved from a database through an application located on the end user's mobile device or located on a remote data storage system conventionally connected to the end user's mobile device and conventionally displayed on an input screen (not shown) on the end user's device so that the end user can then review the electrical state information about the circuit breaker on the input screen. It is to be understood that the current electrical state of the circuit breaker is constantly being conventionally monitored and the current electrical state of the circuit breaker is stored in the database. Alternatively, the end user can also select a particular circuit breaker from a list or category of circuit breakers (step 1904) that was set up, as previously discussed in operation 1800 of creating a listing of electrical outlet/electrical switch information by a category (FIG. 18).

For example, it may be desired by the end user to determine the electrical state of circuit breaker 404 (FIG. 13) which is electrically connected to electrical outlets/electrical switches in the living room of the end user's residence because the end user is going to remodel the living room and the end user wants to make sure that circuit breaker 404 has been turned off so that no one will experience an electrical shock while working on or around the electrical outlets/electrical switches in the living room. It is to be understood that the term "electrical state" refers to whether the circuit breaker is "on", "off", or "tripped". In this manner, the electrical state information about circuit breaker 404 is then conventionally retrieved from a database through an application located on the end user's mobile device or located on a remote data storage system conventionally connected to the end user's mobile device (step 1908) and conventionally displayed on an input screen (not shown) on the end user's device so that the end user can then review the information about the electrical state of circuit breaker 404 on the input screen (step 1910).

It is also to be understood that step 1908 may be completed without an application that has been downloaded onto the end user's mobile device. In this instance, the end user simply scans the NFC tag. The NFC reader in the NFC capable device will display a web page showing information such as a description, room name, and photograph of the particular electrical outlets and/or electrical switches and the circuit breaker electrically connected to that particular electrical outlet and/or electrical switch will be displayed, and the displayed information is associated with the tag's ID located on the particular electrical outlets and/or electrical switches (and such information would also be present in the application downloaded to the end user's device). In this manner, the end user can see what circuit breaker is electrically connected to the particular electrical outlets and/or electrical switches and check on the electrical state of that circuit breaker.

It is to be understood that the NFC tag 50, when read by a conventional device such as the end user's mobile device, the device may also open an application on the end user's mobile device which will contain all the information stored on that NFC tag 50 and the circuit breaker associated with/electrically connected to that NFC tag 50. For example, if there is a cover plate 104 with a NFC tag 50 that was conventionally labeled "tag 404", by holding the device within range of the NFC tag 50, a window would open on the end user's mobile device. This window would have the information on the NFC tag 50. In this case, that would be the number 404, along with what electrical outlets/electrical switches/electrical circuits are electrically connected to breaker 404. In this manner, the end user can see what circuit breaker is electrically connected to the particular electrical outlets and/or electrical switches and check on the electrical state of that circuit breaker. It is to be understood that the information on the NFC tag 50 could also describe light fixtures and appliances that are electrically connected to a particular breaker.

It is to be understood that the NFC tag 50 may also come pre-programmed with a globally unique identifier (GUID) and additional code to link directly to either an application on the end user's mobile device or a website where extended information can be stored and aggregated across all tags located in a building. When the end user's mobile device comes into range of the NFC tag 50, the end user's mobile device conventionally reads the GUID and opens the application on the end user's mobile device. The application would then link the information with the GUID on each NFC tag 50. In this manner, the end user can see what circuit breaker is electrically connected to the particular electrical outlets and/or electrical switches and check on the electrical state of that circuit breaker.

Controlling Circuit Breakers

Regarding the operation 1950 of controlling a circuit breaker, attention is now directed to FIG. 19*b*. With respect to the operation 1950 of controlling a circuit breaker using the outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 1950 of controlling a circuit breaker using the outlet information of an electrical outlet/ electrical switch begins with the start step 1952 after the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user can get information about the electrical state of a particular circuit breaker (step 1952) by either touching or otherwise bringing a conventional device such as the end user's mobile device into close proximity to the NFC tag 50 (step 1956). In this manner, the electrical state information about the circuit breaker that it is connected to that particular NFC tag 50 is then conventionally retrieved from a database through an application located on the end user's mobile device or located on a remote data storage system conventionally connected to the end user's mobile device and conventionally displayed on an input screen (not shown) on the end user's device so that the end user can then review the electrical state information about the circuit breaker on the input screen.

Alternatively, the end user can also select a particular circuit breaker from a list or category of circuit breakers (step 1954) that was set up, as previously discussed in operation 1800 of creating a listing of electrical outlet/ electrical switch information by a category (FIG. 18).

For example, it may be desired by the end user to control the electrical state of circuit breaker 404 (FIG. 13) which is electrically connected to electrical outlets/electrical switches in the living room of the end user's residence because the end user is going to remodel the living room and the end user wants to shut off that circuit breaker 404 so that no one will experience an electrical shock while working on or around the electrical outlets/electrical switches in the living room. It is to be understood that the term "electrical state" refers to whether the circuit breaker is on, off, or tripped. In this manner, the information about the current electrical state of circuit breaker 404 is then conventionally retrieved from a database through an application located on the end user's mobile device or located on a remote data storage system conventionally connected to the end user's mobile device and conventionally displayed on an input screen (not shown) on the end user's device so that the end user can then review the information about the current state of circuit breaker 404 on the input screen, as previously discussed (step 1910 in FIG. 19*a*). It is to be understood that the current electrical state of the circuit breaker is constantly being conventionally monitored and the current electrical state of the circuit breaker is stored in the database. If circuit breaker 404 is currently on, the end user will then select the "off" electrical state on the input screen (step 1958). The circuit breaker 404 will then be conventionally turned to an "off" position and a command is conventionally sent to the circuit breaker to turn off that particular circuit breaker (step 1960).

It is also to be understood that step 1958 may be completed without an application that has been downloaded onto the end user's mobile device. In this instance, the end user simply scans the NFC tag. The NFC reader in the NFC capable device will display a web page showing information such as a description, room name, and photograph of the particular electrical outlets and/or electrical switches and the circuit breaker electrically connected to that particular electrical outlet and/or electrical switch will be displayed, and the displayed information is associated with the tag's ID located on the particular electrical outlets and/or electrical switches (and such information would also be present in the application downloaded to the end user's device). The current state of the circuit breaker electrically connected to the NFC tag will be displayed to the end user. The end user can then change the electrical state of the circuit breaker. Finally, the electrical state of the circuit breaker will be changed to the desired new state, as discussed earlier.

It is to be understood that the NFC tag 50, when read by a conventional device such as the end user's mobile device, the device may also open an application on the end user's mobile device which will contain all the information stored on that NFC tag 50 and the circuit breaker associated with/electrically connected to that NFC tag 50. For example, if there is a cover plate 104 with a NFC tag 50 that was conventionally labeled "circuit breaker tag 404", by holding the device within range of the NFC tag 50, a window would open on the end user's mobile device. This window would have the information on the NFC tag 50. In this case, that would be the number 404, along with what electrical outlets/ electrical switches/electrical circuits are electrically connected to breaker 404. The current electrical state of the circuit breaker electrically connected to the NFC tag will be displayed to the end user. The end user can then change the electrical state of the circuit breaker. Finally, the electrical state of the circuit breaker will be changed to the desired new electrical state, as discussed earlier. It is to be understood that the information on the NFC tag 50 could also describe light fixtures and appliances that are electrically connected to a particular breaker.

It is to be understood that the NFC tag 50 may also come pre-programmed with a globally unique identifier (GUID) and additional code to link directly to either an application on the end user's mobile device or a website where extended information can be stored and aggregated across all NFC tags located in a building and which circuit breaker is attached to which NFC tags. When the end user's mobile device comes into range of the NFC tag 50, the end user's mobile device conventionally reads the GUID and opens the application on the end user's mobile device. The application would then link the information with the GUID on each NFC tag 50. The current electrical state of the circuit breaker electrically connected to the NFC tag will be displayed to the end user. The end user can then change the electrical state of the circuit breaker. Finally, the electrical state of the circuit breaker will be changed to the desired new state, as discussed earlier.

Monitoring a Change in a Circuit Breaker State

Figure 20:
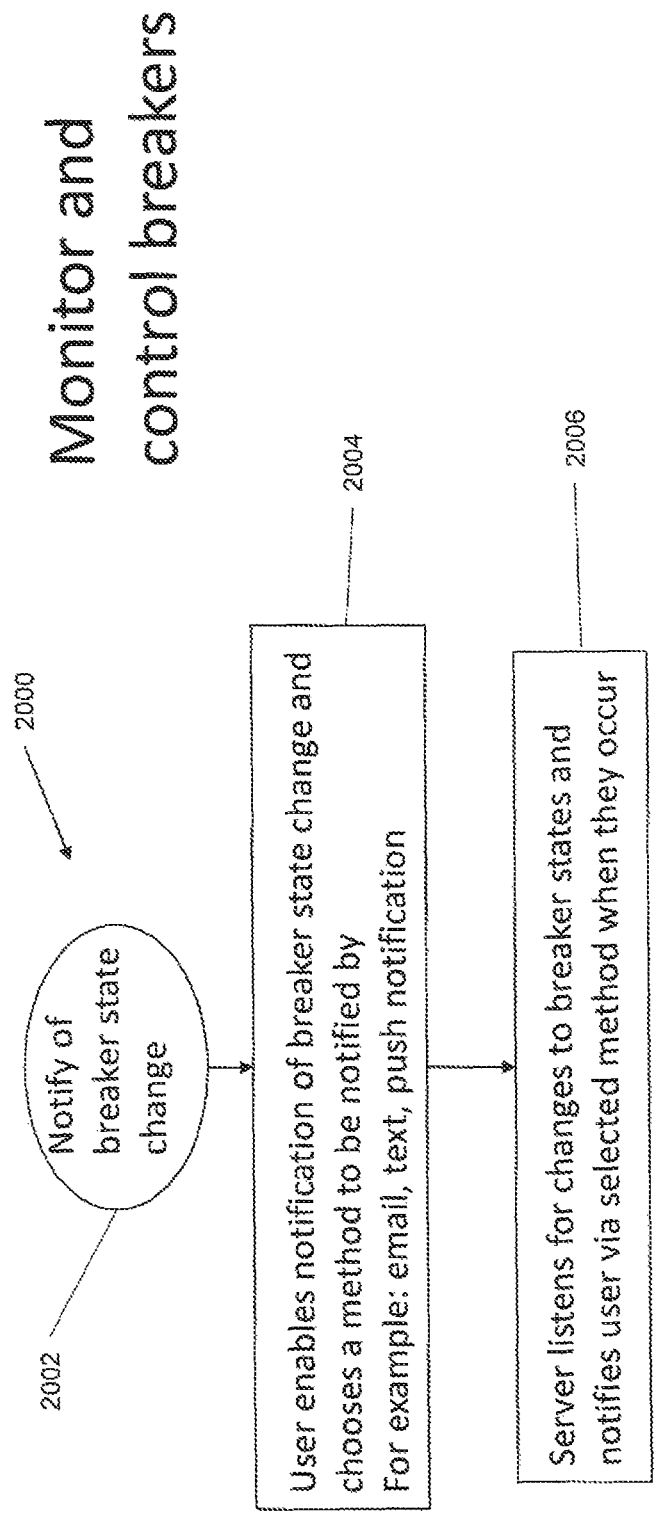
FIG. 20 is a flow chart that illustrates the method of monitoring a change in an electrical state of a circuit breaker, according to the present invention.

Regarding the operation 2000 of monitoring a change in an electrical state of a circuit breaker, attention is now directed to FIG. 20. With respect to the operation 2000 of monitoring a change in an electrical state of a circuit breaker using the outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 2000 of monitoring a change in an electrical state of a circuit breaker using the outlet information of an electrical outlet/electrical switch begins with the start step 2002 after the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user can get information about a change in an electrical state of a particular circuit breaker (step 2002) by getting information about the particular circuit breaker that is electrically connected to the NFC tag 50. In particular, the end user is notified through the end user's mobile device that the electrical state of the particular circuit breaker that is electrically connected to NFC tag 50 has been changed from "on" to "off" (step 2004). It is to be understood that "electrical state" of a circuit breaker refers to the circuit breaker being "on", "off" or "tripped". For example, circuit breaker 404 may have experienced a power surge which caused circuit breaker 404 to change its electrical state from "on" to "tripped" which is a common result when a circuit breaker experiences an undesired power surge. In this manner, the end user will be notified that circuit breaker 404 has changed its state from "on" to "tripped".

It is to be understood that there are several ways in which the end user can be notified when the electrical state of a circuit breaker has been changed. For example, but not limited to, the end user can receive an electronic mail communication (e-mail), a text message, a push notification or the like.

A unique aspect of the present invention is that the end user's mobile device is in constant communication with a conventional server (not shown) that is in communication with the circuit breaker to determine if the current electrical state of the circuit breaker has changed (step 2006). In particular, the server conventionally communicates with the circuit breaker, stores information about the current electrical state of the circuit breaker in a database located on the end user's mobile device or located on a remote data storage system conventionally connected to the end user's mobile device and the end user's mobile device (or whatever device the end user has dedicated to continually check the state of the circuit breaker) continually checks the data base to determine if the current electrical state of the circuit breaker has changed. As discussed above, if the electrical state of the circuit breaker has changed, then the end user is notified of the change in the current electrical state of the circuit breaker. It is to be understood that this constant communication between the server, the circuit breaker and the electrical outlet can also be applied to operations 1900 and 1950.

For example, it may be desired by the end user to determine the current electrical state of circuit breaker 404 (FIG. 13) which is electrically connect to electrical outlets/electrical switches in the fish tank in the living room of the end user's residence because the end user is going to be on vacation and does not want the fish tank filter to stop running if there is a power outage which will cause a change in electrical state of circuit breaker 404. In this manner, the information about the current electrical state of circuit breaker 404 is constantly monitored (step 2006) and, if the electrical state of circuit breaker 404 changes due to a tripped circuit breaker, the end user is notified through the end user's mobile device (step 2006), as discussed above.

It is to be understood that the NFC tag 50, when read by a conventional device such as the end user's mobile device, the device may also open an application on the end user's mobile device which will contain all the information stored on that NFC tag 50 and the circuit breaker associated with/electrically connected to that NFC tag 50. For example, if there is a cover plate 104 with a NFC tag 50 that was conventionally labeled "circuit breaker tag 404", by holding the device within range of the NFC tag 50, a window would open on the end user's mobile device. This window would have the information on the NFC tag 50. In this case, that would be the number 404, along with what electrical outlets/electrical switches/electrical circuits are electrically connected to breaker 404. In this manner, the end user could determine the electrical state of the circuit breaker electrically connected to NFC tag 50. If NFC tag 50 or other important electrical appliances or the like are electrically connected to circuit breaker 404 and circuit breaker 404 changes its electrical state (e.g., goes from "on" to "off"), the end user will then be informed of the change in electrical state of the circuit breaker and make a determination if other measures need to be taken. For example, if the fish tank filter and the automatic light timer are both electrically connected to circuit breaker 404, the end user may have to call a friend to go check on the circuit breaker.

Managing End Users

New End Users

Regarding the operation 2100 of managing new end users, attention is now directed to FIG. 21a. With respect to the operation 2100 of managing new end users using the outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 2100 of managing new end users begins with the start step 2102 after the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user can then be registered by conventionally accessing an application located on the end user's mobile device or located on a remote system conventionally connected to the end user's mobile device. The application will conventionally interact with an input screen (not shown) on the end user's mobile device so that the end user can begin to conventionally set up (create) a new account that will allow the end user to access any or all of the NFC tags 50, 250, 350, 750 and 850 and/or the circuit breakers electrically connected to NFC tags 50, 250, 350, 750 and 850 (step 2104).

It is to be understood that when the end user desires to set up a new account, the end user may use the end user's mobile device to open an application or a web page on the end user's mobile device which will contain all the information regarding NFC tags 50, 250, 350, 750 and 850 and/or the circuit breakers electrically connected to NFC tags 50, 250, 350, 750 and 850. However, in order for the new end user to be able to access and initially record the information about NFC tags 50, 250, 350, 750 and 850 and/or the circuit breakers electrically connected to NFC tags 50, 250, 350, 750 and 850, the end user will have to use the application in order to conventionally set up a new account.

As shown in step 2106, the end user will then conventionally enter the desired information into the input screen of the end user's mobile device that will allow the end user to set up a secure new account. For example, the end user may be required to enter a user name, a password, at least the answer to one (1) security question, and/or the like. After the end user's account information has been entered into the database and conventionally checked to make sure that similar information has not already been entered into the database for another end user and that the end user has entered into the database the required information, the new account details for the new end user are then conventionally saved in the database of accounts (step 2108).

Existing End Users

If the end user has already set up an account, the end user can instead proceed with the operation 2120 of managing existing end users, as shown in FIG. 21*b*. With respect to the operation 2120 of managing existing end users using the outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 2120 of managing new end users begins with the start step 2122 after the installation of the NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user can then conventionally log into the database located on the end user's mobile device or located on a remote data storage system conventionally connected to the end user's mobile device (step 2124). It is to be understood that the database will contain, among other things, information related to NFC tags 50, 250, 350, 750 and 850 and/or the circuit breakers electrically connected to NFC tags 50, 250, 350, 750 and 850. Once the end user's log in credentials have been approved/authenticated (step 2126), the database will conventionally interact with an input screen (not shown) on the end user's mobile device so that the end user will be able to access the information about any or all of the NFC tags 50, 250, 350, 750 and 850 and/or the circuit breakers electrically connected to NFC tags 50, 250, 350, 750 and 850 (step 2128). In this manner, the end user will be allowed to monitor any or all of the NFC tags 50, 250, 350, 750 and 850 and/or the circuit breakers electrically connected to NFC tags 50, 250, 350, 750 and 850 and/or control any or all of the circuit breakers electrically connected to NFC tags 50, 250, 350, 750 and 850, as previously discussed.

It is to be understood that when the end user desires to log into an existing account, the end user may use the end user's mobile device to open an application on the end user's mobile device which will contain all the information stored on the end user's mobile device regarding NFC tags 50, 250, 350, 750 and 850 and/or the circuit breakers electrically connected to NFC tags 50, 250, 350, 750 and 850.

End User Log Out Process

Once the end user has finished monitoring any or all of the NFC tags 50, 250, 350, 750 and 850 and/or the circuit breakers electrically connected to NFC tags 50, 250, 350, 750 and 850 and/or controlling any or all of the circuit breakers electrically connected to NFC tags 50, 250, 350, 750 and 850, the end user can proceed with the operation 2140 of logging off of the database as shown in FIG. 21*c*. With respect to the operation 2140 of logging off of the database using the outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 2140 of logging off of the database begins with the start step 2142 after the end user has finished monitoring any or all of the NFC tags 50, 250, 350, 750 and 850 and/or the circuit breakers electrically connected to NFC tags 50, 250, 350, 750 and 850 and/or controlling any or all of the circuit breakers electrically connected to NFC tags 50, 250, 350, 750 and 850.

As shown in step 2144, the end user can then conventionally log off of the database located on the end user's mobile device or located on a remote data storage system conventionally connected to the end user's mobile device. It is to be understood that the database will contain, among other things, updated information related to NFC tags 50, 250, 350, 750 and 850 and/or the circuit breakers electrically connected to NFC tags 50, 250, 350, 750 and 850. For example, the information about which NFC tags are connected to which circuit breakers may have been changed and/or the electrical state of any or all of the circuit breakers may have been changed.

It is to be understood that when the end user desires to log off of an existing account, the end user may use the end user's mobile device to close an application (end an authentication session) on the end user's mobile device which will contain all the information stored on the end user's mobile device regarding NFC tags 50, 250, 350, 750 and 850 and/or the circuit breakers electrically connected to NFC tags 50, 250, 350, 750 and 850.

Once the end user has been property logged off of the database, the end user data and settings are removed or made inaccessible from the application (step 2146).

Modifying End User Setting

Regarding the operation 2160 of modifying end user settings, attention is now directed to FIG. 21d. With respect to the operation 2160 of modifying end user settings using the outlet information of the electrical outlet faceplate identification tag system 100, electrical outlet identification tag system 200, electrical switch identification tag system 300, electrical outlet identification tag system 700 and electrical switch identification tag system 800 as shown in FIGS. 2-15, the operation 2160 of modifying end user settings begins with the start step 2162 after the end user has logged into the database having information about NFC tags 50, 250, 350, 750 and 850 and/or the circuit breakers electrically connected to NFC tags 50, 250, 350, 750 and 850. As discussed above, the NFC tag 50 is attached to electrical outlet faceplate identification tag system 100, NFC tag 250 is located within electrical outlet 204 in electrical outlet identification tag system 200, NFC tag 350 is located within electrical switch 306 in electrical switch identification tag system 300, NFC tag 750 is located within face plate 704 in electrical outlet identification tag system 700, and NFC tag 850 is located within face plate 804 in electrical switch identification tag system 800.

For simplicity sake, the following example will be based upon the attachment of NFC tag 50 to electrical outlet faceplate identification tag system 100. It is to be understood that the use of NFC tag 250 with electrical outlet 204 in electrical outlet identification tag system 200 and NFC tag 350 with electrical switch 306 in electrical switch identification tag system 300 will operate in substantially the same manner.

Once NFC tag 50 has been attached to electrical outlet faceplate identification tag system 100, as discussed above, the end user can then modify the end user's settings by conventionally accessing the database located on the end user's mobile device or located on a remote data storage system conventionally connected to the end user's mobile device. Once the database has been accessed, the end user can then choose to edit the end user's application settings by conventionally interacting with an input screen (not shown) on the end user's mobile device (step 2164).

It is to be understood that when the end user desires to modify the end user's settings, the end user may use the end user's mobile device to open an application on the end user's mobile device which will contain all the information stored on the end user's mobile device regarding NFC tags 50, 250, 350, 750 and 850 and/or the circuit breakers electrically connected to NFC tags 50, 250, 350, 750 and 850.

As shown in step 2166, the end user will then conventionally enter the desired end user settings information into the input screen of the end user's mobile device that will allow the end user to update the end user's settings. For example, the end user may desire to change the user name, the password, the answer to the security question, and/or the like. After the end user's new settings information have been conventionally entered into the database and conventionally checked to make sure that similar setting information has not already been entered into the database for another end user and that the end user has entered into the database the required new setting information, the new end user setting information is then conventionally saved in the database of accounts (step 2168).

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

All patents, publications, scientific articles, web sites, and other documents and materials referenced or mentioned herein are indicative of the levels of skill of those skilled in the art to which the invention pertains, and each such referenced document and material is hereby incorporated by reference to the same extent as if it had been incorporated by reference in its entirety individually or set forth herein in its entirety.

The applicant reserves the right to physically incorporate into this specification any and all materials and information from any such patents, publications, scientific articles, web sites, electronically available information, and other referenced materials or documents to the extent such incorporated materials and information are not inconsistent with the description herein.

The written description portion of this patent includes all claims. Furthermore, all claims, including all original claims as well as all claims from any and all priority documents, are hereby incorporated by reference in their entirety into the written description portion of the specification, and Applicant(s) reserve the right to physically incorporate into the written description or any other portion of the application, any and all such claims. Thus, for example, under no circumstances may the patent be interpreted as allegedly not providing a written description for a claim on the assertion that the precise wording of the claim is not set forth in haec verba in written description portion of the patent.

The claims will be interpreted according to law. However, and notwithstanding the alleged or perceived ease or difficulty of interpreting any claim or portion thereof, under no circumstances may any adjustment or amendment of a claim or any portion thereof during prosecution of the application or applications leading to this patent be interpreted as having forfeited any right to any and all equivalents thereof that do not form a part of the prior art.

All of the features disclosed in this specification may be combined in any combination. Thus, unless expressly stated otherwise, each feature disclosed is only an example of a generic series of equivalent or similar features.

It is to be understood that while the invention has been described in conjunction with the detailed description thereof, the foregoing description is intended to illustrate and not limit the scope of the invention, which is defined by the scope of the appended claims. Thus, from the foregoing, it will be appreciated that, although specific embodiments of the invention have been described herein for the purpose of illustration, various modifications may be made without deviating from the spirit and scope of the invention. Other aspects, advantages, and modifications are within the scope of the following claims and the present invention is not limited except as by the appended claims.

The specific methods and compositions described herein are representative of preferred embodiments and are exemplary and not intended as limitations on the scope of the invention. Other objects, aspects, and embodiments will occur to those skilled in the art upon consideration of this specification, and are encompassed within the spirit of the invention as defined by the scope of the claims. It will be readily apparent to one skilled in the art that varying substitutions and modifications may be made to the invention disclosed herein without departing from the scope and spirit of the invention. The invention illustratively described herein suitably may be practiced in the absence of any element or elements, or limitation or limitations, which is not specifically disclosed herein as essential. Thus, for example, in each instance herein, in embodiments or examples of the present invention, the terms "comprising", "including", "containing", etc. are to be read expansively and without limitation. The methods and processes illustratively described herein suitably may be practiced in differing orders of steps, and that they are not necessarily restricted to the orders of steps indicated herein or in the claims.

The terms and expressions that have been employed are used as terms of description and not of limitation, and there is no intent in the use of such terms and expressions to exclude any equivalent of the features shown and described or portions thereof, but it is recognized that various modifications are possible within the scope of the invention as claimed. Thus, it will be understood that although the present invention has been specifically disclosed by various embodiments and/or preferred embodiments and optional features, any and all modifications and variations of the concepts herein disclosed that may be resorted to by those skilled in the art are considered to be within the scope of this invention as defined by the appended claims.

The invention has been described broadly and generically herein. Each of the narrower species and sub-generic groupings falling within the generic disclosure also form part of the invention. This includes the generic description of the invention with a proviso or negative limitation removing any subject matter from the genus, regardless of whether or not the excised material is specifically recited herein.

It is also to be understood that as used herein and in the appended claims, the singular forms "a," "an," and "the" include plural reference unless the context clearly dictates otherwise, the term "X and/or Y" means "X" or "Y" or both "X" and "Y", and the letter "s" following a noun designates both the plural and singular forms of that noun.

Other embodiments are within the following claims. Therefore, the patent may not be interpreted to be limited to the specific examples or embodiments or methods specifically and/or expressly disclosed herein. Under no circumstances may the patent be interpreted to be limited by any statement made by any Examiner or any other official or employee of the Patent and Trademark Office unless such statement is specifically and without qualification or reservation expressly adopted in a responsive writing by Applicants.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

Therefore, provided herein is a new and improved identification tag that can be used to identify which electrical breaker in the electrical circuit breaker box or panel is electrically connected to and controls a particular electrical outlet (or electrical circuit/electrical switch). The preferred identification tag that can be used to identify which electrical breaker in the electrical circuit breaker box or panel is electrically connected to and controls a particular electrical outlet (or electrical circuit/electrical switch), according to various embodiments of the present invention, offers the following advantages: ease of use; lightness in weight; the ability to allow the information to be accessed through a device with near field communications (NFC) capabilities without removing the cover faceplate; the ability to identify all outlets, switches, fixtures, and appliances connected to a particular circuit breaker; the ability to use the tag in a commercial or residential building; durability; improved ability to identify which electrical breaker in the electrical circuit breaker box or panel is electrically connected to and controls a particular electrical outlet (or electrical circuit/ electrical switch); the ability to attach the tag to an electrical outlet, the ability to attach the tag to an electrical switch face plate; the ability to attach the tag to an electrical switch; reduced downtime when replacing an electrical switch, electrical outlet, electrical circuit and/or circuit breaker; the ability to create a list of electrical outlets/electrical switches associated with the identification tag(s); the ability to monitor and/or control a circuit breaker through the use of the identification tag(s); and the ability to manage the users with which identification tag(s) are associated. In fact, in many of the preferred embodiments, these advantages are optimized to an extent that is considerably higher than heretofore achieved in prior, known identification systems and devices used to identify which switch controls a specific circuit (or electrical outlet/electrical switch) in a residential or commercial building.

We claim:

1. A method for creating a list identifying which electrical outlets are electrically connected to a circuit breaker, comprising the steps of:
   providing an electrical outlet faceplate cover having a plurality of electrical outlet openings and a fastener located between the plurality of electrical outlet openings such that the electrical outlet faceplate cover is located over an electrical outlet;
   providing a circuit breaker panel having at least one circuit breaker located on the circuit breaker panel;
   providing a near field communications tag located on a back side of the electrical outlet faceplate cover, wherein the near field communications tag is operatively connected to the fastener such that the near field communications tag is capable of containing information related to which of the at least one circuit breaker is electrically connected to the electrical outlet;
   storing information related to which of the at least one circuit breaker is electrically connected to the electrical outlet in a database;
   providing a remote device with access to the database;
   rendering a user interface through which a user, via the remote device, can define an electrical outlet category, wherein the electrical outlet category specifies a relationship between the electrical outlet and the at least one circuit breaker;
   receiving the user defined electrical outlet category in the database via the remote device;
   creating, in a database, the user defined electrical outlet category based upon the relationship between the electrical outlet and the at least one circuit breaker; and
   providing access to execute a query regarding the user defined electrical outlet category through the remote device.

2. The method for creating a list identifying which electrical outlets are electrically connected to a circuit breaker, as in claim 1, wherein the method is further comprised of the steps of:
   determining a desired electrical outlet category;
   accessing the database to determine if the desired electrical outlet category has been stored in the database; and
   if the desired electrical outlet category has been stored in the database, providing access to the desired electrical outlet category.

3. The method for creating a list identifying which electrical outlets are electrically connected to a circuit breaker, as in claim 1, wherein the method is further comprised of the step of:
   determining which of the at least one circuit breaker is electrically connected to the electrical outlet.

4. The method for creating a list identifying which electrical outlets are electrically connected to a circuit breaker, as in claim 3, wherein the determining step is further comprised of the steps of:
   locating the electrical circuit breaker panel; and
   turning off and on the at least one circuit breaker to determine which of the at least one circuit breaker is electrically connected to the electrical outlet.

5. A method for identifying which electrical outlets are electrically connected to a circuit breaker, comprising the steps of:
   providing an electrical outlet faceplate cover having a plurality of electrical outlet openings and a fastener located between the plurality of electrical outlet openings such that the electrical outlet faceplate cover is located over an electrical outlet;
   providing a circuit breaker panel having at least one circuit breaker located on the circuit breaker panel;
   providing a near field communications tag located on a back side of the electrical outlet faceplate cover, wherein the near field communications tag is operatively connected to the fastener such that the near field communications tag is capable of containing information related to which of the at least one circuit breaker is electrically connected to the electrical outlet;
   providing a remote device with access to a database;
   bringing the remote device into close proximity to the electrical outlet, wherein the remote device can read the information contained on the near field communications tag related to which of the at least one circuit breaker is electrically connected to the electrical outlet;
   rendering a user interface through which a user, via the remote device, can define a relationship between the electrical outlet and the at least one circuit breaker,
   receiving the user defined relationship between the electrical outlet and the at least one circuit breaker in the database via the remote device;
   creating, in a database, the user defined relationship between the electrical outlet and the at least one circuit breaker; and
   providing access to execute a query regarding the user defined relationship between the electrical outlet and the at least one circuit breaker.

6. The method for identifying which electrical outlets are electrically connected to a circuit breaker, as in claim 5, wherein the method is further comprised of the step of:
   determining which of the at least one circuit breaker is electrically connected to the electrical outlet.

7. The method for identifying which electrical outlets are electrically connected to a circuit breaker, as in claim 6, wherein the method is further comprised of the step of:
   recording which of the at least one circuit breaker is electrically connected to the electrical outlet.

8. The method for identifying which electrical outlets are electrically connected to a circuit breaker, as in claim 6, wherein the determining step is further comprised of the steps of:
   locating the electrical circuit breaker panel; and
   turning off and on the at least one circuit breaker to determine which of the at least one circuit breaker is electrically connected to the electrical outlet.

9. A method for monitoring an electrical state of a circuit breaker which is electrically connected to an electrical outlet, comprising the steps of:
   providing an electrical outlet faceplate cover having a plurality of electrical outlet openings and a fastener located between the plurality of electrical outlet openings such that the electrical outlet faceplate cover is located over an electrical outlet;
   providing a circuit breaker panel having at least one circuit breaker located on the circuit breaker panel;
   providing a near field communications tag located on a back side of the electrical outlet faceplate cover, wherein the near field communications tag is operatively connected to the fastener such that the near field communications tag is capable of containing information related to which of the at least one circuit breaker is electrically connected to the electrical outlet;
   storing information related to which of the at least one circuit breaker is electrically connected to the electrical outlet in a database;

providing a remote device with access to the database;
rendering a user interface through which a user, via the remote device, can define the relationship between the electrical outlet and the at least one circuit breaker;
receiving the user defined relationship between the electrical outlet and the at least one circuit breaker in the database via the remote device;
creating, in a database, the user defined relationship between the electrical outlet and the at least one circuit breaker;
providing access to execute a query regarding the user defined relationship between the electrical outlet and the at least one circuit breaker;
determining an electrical state of the at least one circuit breaker; and
providing, via the remote device, an electrical state of the at least one circuit breaker.

10. The method for monitoring an electrical state of a circuit breaker which is electrically connected to an electrical outlet, as in claim 9, wherein the method is further comprised of the step of:
bringing the remote device into close proximity to the electrical outlet, wherein the remote device can access the information contained on the near field communications tag.

11. The method for monitoring an electrical state of a circuit breaker which is electrically connected to an electrical outlet, as in claim 9, wherein the method is further comprised of the steps of:
rendering the user interface through which the user, via the remote device, can define a circuit breaker category, wherein the circuit breaker category specifies a relationship between the electrical outlet and the at least one circuit breaker;
receiving the user defined circuit breaker category in the database via the remote device;
creating, in a database, the user defined circuit breaker category based upon the relationship between the electrical outlet and the at least one circuit breaker; and
providing access to execute a query regarding the user defined circuit breaker category through the remote device.

12. The method for monitoring an electrical state of a circuit breaker which is electrically connected to an electrical outlet, as in claim 9, wherein the method is further comprised of the step of:
determining which of the at least one circuit breaker is electrically connected to the electrical outlet.

13. The method for monitoring an electrical state of a circuit breaker which is electrically connected to an electrical outlet, as in claim 12, wherein the determining step is further comprised of the steps of:
locating the electrical circuit breaker panel; and
turning off and on the at least one circuit breaker to determine which of the at least one circuit breaker is electrically connected to the electrical outlet.

14. The method for monitoring an electrical state of a circuit breaker which is electrically connected to an electrical outlet, as in claim 12, wherein the method is further comprised of the step of:
recording which of the at least one circuit breaker is electrically connected to the electrical outlet.

15. A system for identifying which electrical outlets are electrically connected to a circuit breaker, comprising:
an electrical outlet faceplate cover having a plurality of electrical outlet openings and a fastener located between the plurality of electrical outlet openings such that the electrical outlet faceplate cover is located over an electrical outlet;
a circuit breaker panel having at least one circuit breaker located on the circuit breaker panel; and
a near field communications tag located between a back side of the electrical outlet faceplate cover and the electrical outlet such that the near field communications tag contains information related to which of the at least one circuit breakers is electrically connected to the electrical outlet.

* * * * *